United States Patent
Davis

(10) Patent No.: US 9,779,634 B2
(45) Date of Patent: Oct. 3, 2017

(54) NATURAL ORIENTATION INDUCTION TOOL APPARATUS AND METHOD

(71) Applicant: Ronald Dell Davis, Burlingame, CA (US)

(72) Inventor: Ronald Dell Davis, Burlingame, CA (US)

(*) Notice: Subject to any disclaimer, the term of this patent is extended or adjusted under 35 U.S.C. 154(b) by 0 days.

(21) Appl. No.: 15/419,145

(22) Filed: Jan. 30, 2017

(65) Prior Publication Data

US 2017/0178533 A1  Jun. 22, 2017

Related U.S. Application Data

(62) Division of application No. 14/502,873, filed on Sep. 30, 2014, now Pat. No. 9,589,478.

(60) Provisional application No. 61/884,833, filed on Sep. 30, 2013.

(51) Int. Cl.
*G09B 19/00* (2006.01)
*G06F 3/16* (2006.01)
*H04R 1/10* (2006.01)

(52) U.S. Cl.
CPC ............. *G09B 19/00* (2013.01); *G06F 3/165* (2013.01); *H04R 1/10* (2013.01); *H04R 2460/13* (2013.01)

(58) Field of Classification Search
CPC ........ H04N 17/003; G10L 19/00; G09B 9/00; G09B 19/00; H03G 3/02; H03G 3/3026; H04R 3/00; H04R 5/00; H04R 1/10; H04R 2460/13; G06F 3/165
See application file for complete search history.

(56) References Cited

U.S. PATENT DOCUMENTS 3,393,279 A  7/1968  Flanagan
3,647,970 A  3/1972  Flanagan

OTHER PUBLICATIONS

The Gift of Learning, Proven New Methods for Correcting ADD, Math, and Handwriting Problems, Ronald D. Davis, First Edition Aug. 2003, pp. 115-146.
The Gift of Dyslexia, Why Some of the Smartest People Can't Read . . . and How They Can Learn, Ronald D. Davis, 1994, pp. 153-189.

*Primary Examiner* — Timothy A Musselman
(74) *Attorney, Agent, or Firm* — Pate Baird, PLLC

(57) ABSTRACT

An apparatus for training learning disabled subjects, such as autistic children, induces sound waves into a body of a user through two paths, one heard by the ears through air and the other through a liquid or solid in contact with tissues, such as skin and skeleton on the back of a user, below the collar and centered across the vertical axis of the spine. Two transducers produce waves in the audible sound spectrum, repeat persistently, and provide a tone about a location on which the subject may focus attention. A controller and actuator adhered to the skin by an adhesive gel pad against the back of a wearer. The sound, repeating (after a selected delay), decaying, and seeming to originate above and behind the head of a wearer is a waveform becomes a focus; effective to orient a subject, who lacks natural, self-orientation.

20 Claims, 14 Drawing Sheets

NATURAL ORIENTATION INDUCTION TOOL APPARATUS AND METHOD

RELATED APPLICATIONS

This application: is a divisional of U.S. patent application Ser. No. 14/502,873, filed Sep. 30, 2014; which claims the benefit of U.S. Provisional Patent Application Ser. No. 61/884,833, filed Sep. 30, 2013; both of which are hereby incorporated by reference in their entirety.

BACKGROUND

1. The Field of the Invention

This invention relates to sound generation and, more particularly, to novel systems and methods for providing aural and tactile signals to a human being.

2. The Background Art

Autism is a condition characterized by persons being overwhelmed by sensory perceptions, which become distorted (disoriented). Typically, the life of an autistic individual is characterized by overwhelming chaos due to sensitivity to external stimuli, including sight, sound, touch, taste, and smell. Various systems have been developed for treating autism.

Previous work has been done by the inventor in the area of orientation counseling and procedures. It has been provided in the past to place a headset or earbuds on a user in order to generate a sound that is detected by the ears, processed by the brain, and treated as a focal point or an orientation point for an individual. Once focused, perceptions become accurate or undistorted (oriented). However, many persons, particularly young children or severely affected subjects, may not be able to wear a headset in order to listen to the sounds that will help to focus attention, direct the "mind's eye," toward the sound perceived to be at a particular position in space.

For example, the essence of stereo is the stereophonic projection of sound from different locations. Stereophonic headphones, for example, permit different tracks of music or other sound to be passed to the ears, thus giving an impression of position and distance. In reality, stereo sound is propagated by a speaker relatively nearer each ear. However, by changing the volume of different tracks, particular sounds may be played back to a listener in such a way as to appear to be originating at different locations, to move with time, or the like. However, experts on the subject have informed the inventor that it is impossible to exactly locate in space a perceived location for the sound. More particularly, the inventor was informed that it was impossible to maintain such a location with respect to an individual.

The David Autism Approach is documented in various books and websites available internationally. Unfortunately, many autistic individuals are unable to wear headphones, or unwilling to do so. Thus, an ability to receive a sound signal, which has been generated with certain artifacts (such as accommodating the geometry and attenuation of the hearer's head) and balanced to seem like it is coming from a particular point in space fixed with respect to the person, is not heretofore possible. However, it would be an advance in the art to provide a system, that generates sound, in a way that such a system can be created and then worn in such a location and manner that it is not easily removed by a subject, and does not interfere with movement of the head, and normal daily activities.

SUMMARY OF THE INVENTION

In view of the foregoing, in accordance with the invention as embodied and broadly described herein, a method and apparatus are disclosed in one embodiment of the present invention as including Natural Orientation Induction Tool (NOIT) including a driver and an actuator. Typically the driver will be embodied in a case having a top and bottom on which are located buttons for control and for increasing and decreasing times, delays, frequencies, and the like. Similarly, a power button to turn the system on and off will be included. In certain embodiments, a USB port is provided in order to interface with other computer systems for programming, processing, analyzing, determining, presenting, downloading, uploading data, downloading programs, and so forth.

Learning disabilities including autism, dyslexia, attention deficit disorder, attention deficit hyperactivity disorder, and the like probably have organic causes that relate to the physiology of a subject. The sources, consequences, cures, and other medical features of these disabilities are irrelevant to the instant invention. The inventor finds debate over causes and cures of disabilities has ignored largely research into educating such subjects, regardless of cause and cure. The result of some disabilities is distorted perception (disorientation). Orientation (undistorted perception) can be taught or trained by education. The inventor's books "The Gift of Dyslexia" (with Eldon M. Braun, Perigee, 2010) and "The Gift of Learning" (with Eldon M. Braun, Perigee, 2003) are hereby incorporated by reference in their entireties, and describe orientation.

For example, certain facts were discovered by the inventor, who is autistic and dyslexic. Having been unable to communicate orally in sentences before the age of 17 and functionally illiterate to the age of 38, the inventor developed the Davis Autism Approach.

However, certain subjects are so hypersensitive to sound and touch, and live in such a state of sensory overload and confusion, that they cannot be communicated with effectively by speech. They cannot follow instructions, and cannot or will not wear head phones or ear buds, nor do other activities required to teach them. They thus have no way to learn to reduce the chaos and confusion sufficiently to begin accurately perceiving, without distortion (orienting), the sensory perceptions detected by their five senses (sight, sound, touch, smell, taste).

It has been found by the inventor that drawing the attention of a subject to a location above and behind the center of the head, consistently and persistently reduces confusion. Moreover, the inventor has demonstrated that this mechanism allows a subject to reduce confusion sufficiently that the subject will accurately perceive the sensations of the five senses, rather than remaining hypersensitive to and confused by them.

An apparatus and method for educating a student in spite of a learning disability is provided herein. About ten to about fifteen percent of autistic subjects are so unreachable by speaking, touching, or other common interactions that to do so may be dangerous. Touching a student with a set of head phones may result in a severe injury from biting by the subject. Therefore, it is necessary to educate these subjects or students sufficiently by other means. Accordingly, a Normal Orientation Induction Tool (NOIT) is directed toward educating a subject. Education is possible without addressing cause nor curing the cause. Instead it has been found that education can proceed to teach certain skills that have been missed previously due to the learning disability. This can occur in spite of a learning disability.

To reduce confusion it is only necessary to become "oriented," where orienting is obtaining undistorted perceptions. This is done by simply focusing attention at a single location in space, relative to the individual, not any environment, sufficiently long for the subject to begin "perceiving" accurately the sensations and observations reported by the subject's five senses. It has been found that once certain education has occurred, such as learning certain words, becoming aware of self and boundaries, learning such abstractions as ownership of things and appropriateness of certain behaviors, confusion may be permanently reduced and other education can proceed.

Education can proceed immediately, under the influence of the NOIT, as well as later, after being weaned from the NOIT. About half the subjects self-wean by simply progressing to the point they no longer require nor want it. About a quarter of the subjects readily wean from the NOIT under the direction of a caregiver guided by a facilitator. Another quarter of the subjects persist in their use of the NOIT or an alternative to some extent over an extended period of time. For example, an education regimen may typically occur over a period of about four months. However, some subjects have moved from the minimum delay between sound repetitions to the maximum possible in a period of three days. Others rely on the NOIT or an alternative during some period of a day on some periodic basis for two years.

A NOIT may involve programmable electronic components as well as transducers for controlling and generating, respectively, sounds. These sounds are propagated through air to the ears of a subject (wearer of the NOIT) and through the tissues and skeleton of the subject as well. The sounds are propagated repeatedly, persistently, and audibly at a volume of sound insufficient to be disturbing or aggravating to the subject. The sound is like a bell tone, but has been found to be best when generated by a mallet striking a titanium rod about five inches (about thirteen centimeters) long and half an inch (about thirteen millimeters) in diameter, suspended on tension wires from a wooden cradle the rod is never permitted to touch. Piezoelectric transducers in the actuator operate at a frequency selected to accurately reproduce the resonant frequency of the titanium rod.

Typically, the driver and actuator will be made as two parts. The driver typically will secure to a mount, on the actuator, interfacing with some location of the driver. Typically, one engaging portion, such as a rail or the like, will act as a mount secured to, or formed as part of, the actuator. The driver will then slide to engage the mount, also making electrical contact through mutual electrical contacts on each portion. Thus, for example, a receiver in the driver package may slide along and against a rail or mount on the actuator package, thus making a total system.

In certain embodiments, the actuator may include a gel pad and a backer or substrate. Typically, the gel pad may be formed of a thick but compliant gel, which may or may not be placed in a matrix, such as fabric material, gridded polymeric base, sheet of plastic, stiff gel, or the like. Typically, the backer then will mount transducers and on a stiffer and more substantial mechanical support. The backer thus forms a mechanical support for maintaining dimensional stability of the gel pad.

In certain embodiments, the system may include a latch for rapid securement and removal of the driver from the actuator. One benefit of this arrangement is that the gel pad, which includes an adhesive portion, may contact and adhere to the skin of a user quite readily. If needed, pressure may be applied in order to activate or secure the adhesive to the skin of a user. Thereupon, the latch system may be engaged to secure the driver to the actuator portion.

In certain embodiments, wires may extend through the backer in order to connect piezoelectric transducers to the driver. The driver operates as a controller, by providing the electrical signals required by actuators to impose vibrations into the gel pad from the piezoelectric transducers as actuators on the backer.

In certain embodiments, a lanyard may be connected to a loop in order to secure the system against dropping. For example, adhesives will not be difficult to remove from the skin of a user. Accordingly, they may, in time, be degraded or otherwise caused to fail. Accordingly, one may secure the device by a lanyard connected to a portion of clothing.

In certain embodiments, a mating edge may be formed to interface between the driver and the actuator across a mount in order to secure the driver to the actuator. Meanwhile, inside the driver is a circuitry formed on a circuit board and driven by a battery. The battery also drives the piezoelectric contacts in order to implement the frequency, periodicity, and the like of an aural sound, a vibration, or borth to be heard or otherwise sensed by a wearer. A timer module may be controlled by control buttons available on the outside of the system.

An apparatus for training learning disabled subjects, such as autistic children, induces sound waves into a body of a user through two paths. One is sound heard through air and the other is a sound wave propagated through at least one of liquid and solid in contact with tissues, such as skin and underlying tissues of a wearer (subject). It has been found that the apparatus may be placed on the back to be inaccessible to a wearer. The system and apparatus may provide a tone, typically having a constant tonal frequency, but decaying over time. Repetition of the tone periodically engages the attention of the wearer to concentrate at a location in space dictated by the stereophonic nature of the sound. Having two transducers spaced apart and producing waves in the audible sound spectrum, the system's persistent and external-seeming position provides orientation to learning disabled subjects.

The system may include one or more computers, processors, and other components to implement the controller. The controller becomes part of a driver, made up of the controller, a protective housing around it, certain electronics within it, a processor, a battery powering it, and an a first engagement portion. The functions, steps, and decisions may be implemented in a computer.

The engagement portion engages an actuator, comprising at least two transducers. The engagement portion may have a complementary component on the actuator to effect engagement. Engagement may render the connection between the controller and the actuator either permanent or selectively separable.

The actuator typically comprises an adhesive surface opposite the engagement with the controller. This adhesive portion may be a gel pad, a filled matrix formed of an elastomeric polymer or a fabric, and a filling of some hydrogel that absorbs water to become tacky. Thus, the hydrogel may be cleaned somewhat and may be renewed by adding back water that evaporates or drying out excess water absorbed by exposure thereto.

The actuator's "second engagement portion" operably connects to the first engagement portion. This may be mechanical such as a fitted or mating pair of parts, glue, fasteners or the like. Selective securement and detachment of the first and second engagement portions with respect to each other provides for ease of application of the system to a wearer (subject). By removing the actuator (containing a substrate, securement system or second engagement portion, piezoelectric or other electromechanical transducers, and an adhesive pad such as a "gel" layer) from the controller, one may more easily see, manipulate, position, bend, press, and otherwise apply the actuator to the back of a wearer (user, subject).

The gel portion of the actuator may act as a conductor of sound, coupling a surface of a tissue (e.g., skin) of a subject to the transducers, selected to be at least two transducers in order the "throw" the sound so as to make it seem to originate near a location above and behind the head of the subject wearing the system.

The transducers are operably connected to the controller to oscillate in a range of frequencies corresponding to an audible range of a human. The actuator is connected to the tissue in contact with one face of the actuator, and to the air opposite and in contact with the opposite face of the actuator, in a way calculated to propagate a first sound wave, within the audible range, to the ears of the user (wearer, subject) through ambient air, and a second sound wave propagated by the transducers directly through the gel pad (and possibly the substrate or framing of the actuator) to the tissues (soft tissues and bone) of the body of a user.

The range may be selected to be from about 20 Hertz to about 20,000 Hertz. A range that seems to work best is from about 3000 Hertz to about 5000 Hertz, with a target of about 4000 Hertz. The controller is programmed (by hardware, software, or firmware) to control the oscillation of the transducers (usually at least two) with an energy corresponding to a sound volume audible through ambient air to a user wearing the apparatus. Hypersensitivity of some wearers militates for adjustable volume. Later, as they become oriented, it has been observed that they often lose the hypersensitivity and thus can tolerate, or even require a greater volume, available by setting the controller to provide it.

The controller is programmed to control the transducers to initiate a first tone at a first time, to extend over a first period of time, at a first volume of the tone during the first period of time. Meanwhile, the controller causes the transducers, operably connected thereto, to initiate a second tone at a second time, to extend over a second period of time. These may be modulated to create artifacts or features that make them appear to be (sound like) originating from a location above and behind the head of a wearer (user, subject).

The controller is programmed to impose a delay between the first time and the second time, and then repeat the tone. Thus the first tone is at the same frequency of sound as the second tone, and the volume of the tones decays during the first period of time. The controller is programmed to control an elapsed time, between the first time and the second time, and thus faithfully repeat a characteristic (or preferably all of the characteristics) of the first tone. Characteristics of interest comprise duration, volume, delay, decay rate, and frequency corresponding to the repetition thereof.

Thus, the controller may be programmed to produce the first tone through the at least two transducers to be substantially identical in frequency and volume throughout the respective first and second time periods corresponding thereto. The actuator, connected to the surface of the tissue through a contiguous path of material absent appreciable air (often comprising principally water, just as the body does) propagates the sound waves so generated directly into the body, while simultaneously propagating the tone through the air to be picked up by the ears of the wearer as a sound originating a location away from the user, always the same location.

The actuator may be built on or around a substrate of fabric, film, rubber, plastic, or the like. It may be cast, calendared, pressed, woven, non-woven, etc. It has a securement shaped and positioned to selectively engage at least one of the first engagement portion, the housing, and the circuit board of the controller.

The actuator is thus operably securable to the controller to engage the controller mechanically and electrically. A battery in the controller (e.g., inside the housing) may power the electronics of the controller as well as the transducers to cause them to oscillate. The piezoelectric transducers, sized and positioned to produce sound waves through solids, liquids, and air may rely on a quantity of material (such as a hydro-gel, or water-based thixotropic or even a comparatively solid material) positioned, sized, and shaped to secure the actuator to the skin of a subject.

A gel selected for testing was found to have high water absorption and adhesive properties effective to adhere to the subject. The gel was compounded to provide a substantially contiguous and continuous path for sound waves, generated by the piezoelectric transducers, to conduct into the subject.

The housing secures selectively to the actuator for operation. Connection to a circuit board (which may be the board hosting a processor, memory, and other peripheral or required components) should be operable to communicate from the controller to the actuator. The housing may be shaped to receive or be received by a portion (e.g. mount, bracket, sleeve, way, slide, etc.) of the actuator to make the two (actuator and controller) selectively securable and removable.

In some embodiments, the actuator may be built right on or as an integral part of the housing of the controller. This provides a small package, but may benefit from being made of a softer (flexible, elastomeric) material for the housing to make better contact with a user (wearer).

Buttons on the outside of the controller's housing may be operably connected to receive inputs from an operator (e.g., caregiver, custodian, etc. of a subject who is learning disabled) and effective to alter (adjust, direct, program, etc.) operation of the controller.

A system in accordance with the invention thus enables a new method of training a learning disabled subject. By first providing one of the foregoing embodiments of a system in accordance with the invention (e.g., controller, actuator with piezoelectric transducers sized and positioned to produce sound waves and propagate them toward a wearer by two directions and two modes (air to ear, and contact to body).

Securing the actuator to a subject may be followed by setting parameters controlling the controller. This occurs before securing the controller to the actuator, and thus integrating the system on the user. One reason for the development of the system was to be able to locate in at a location inaccessible by the user wearing it, yet fixed with respect to the user.

In operation, the system generates a sound waveform (e.g., audible tone of constant frequency and decaying volume) effective to orient a subject, who lacks natural, self-orientation. The orienting sound is selected to be repeating from about every three to about every 20 seconds initially. A suitable target for repetition period has been about 8 seconds. The user hears the sound (apparently) from a remote location above and behind a center of the head of a user. Typically it is a location behind the head and just above eye level. In other embodiments it is about six inches (15 cm) above and about the same distance behind the head of a user wearer.

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore, not to be considered limiting of its scope, the invention will be described with additional specificity and detail through use of the accompanying drawings in which:

DETAILED DESCRIPTION OF THE PREFERRED EMBODIMENTS

Figure 1:
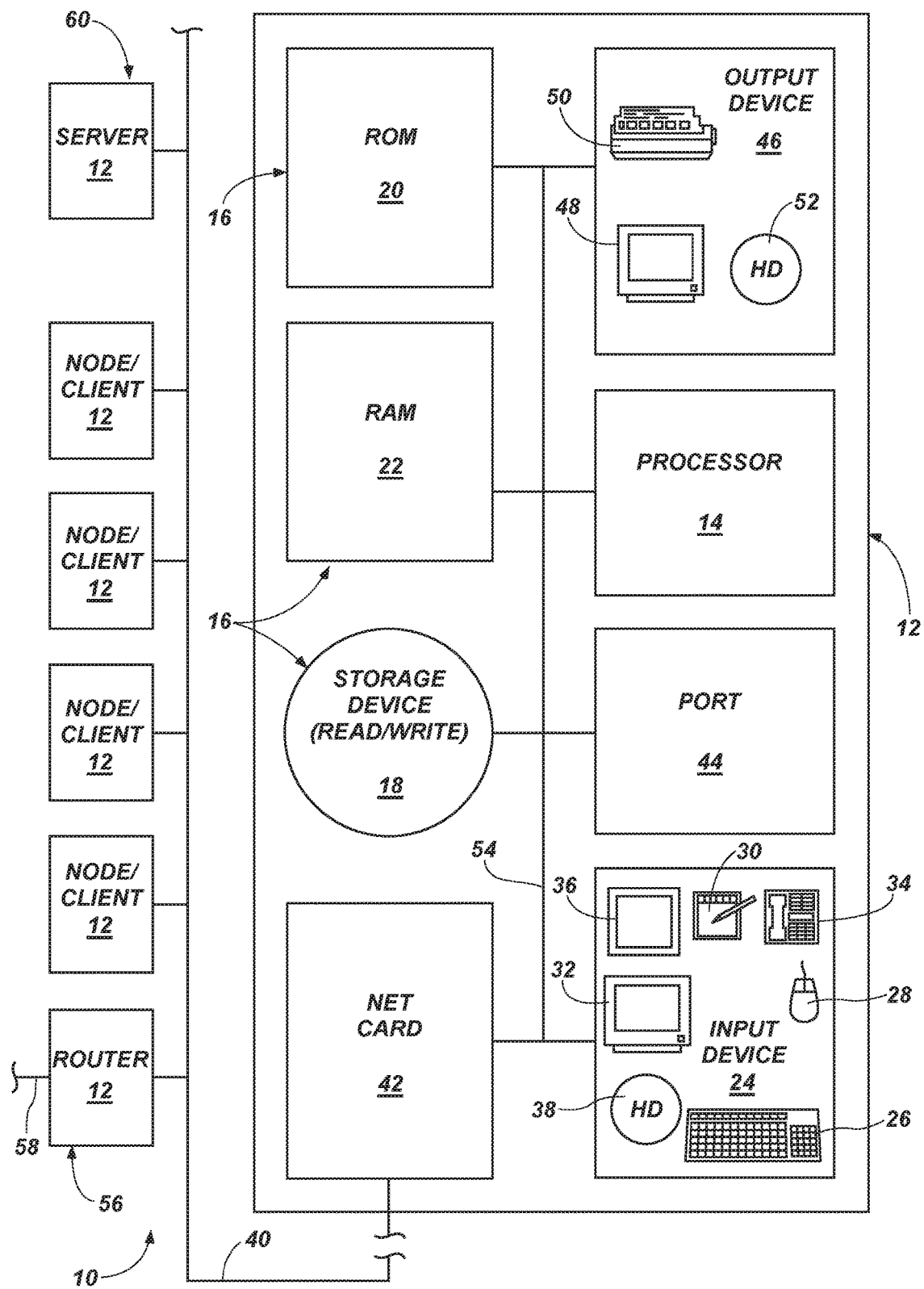
FIG. 1 is a schematic diagram of a computer system, including an individual computer having a processor, memory, and other elements, connected to a network, that network connects to various other computers or nodes, and to an internetwork.

It will be readily understood that the components of the present invention, as generally described and illustrated in the drawings herein, could be arranged and designed in a wide variety of different configurations. Thus, the following more detailed description of the embodiments of the system and method of the present invention, as represented in the drawings, is not intended to limit the scope of the invention, but is merely representative of various embodiments of the invention. The illustrated embodiments of the invention will be best understood by reference to the drawings, wherein like parts are designated by like numerals throughout.

Referring to FIG. 1, an apparatus 10 or system 10 for implementing the present invention may include one or more nodes 12 (e.g., client 12, computer 12). Such nodes 12 may contain a processor 14 or CPU 14. The CPU 14 may be operably connected to a memory device 16. A memory device 16 may include one or more devices such as a hard drive 18 or other non-volatile storage device 18, a read-only memory 20 (ROM 20), and a random access (and usually volatile) memory 22 (RAM 22 or operational memory 22). Such components 14, 16, 18, 20, 22 may exist in a single node 12 or may exist in multiple nodes 12 remote from one another.

In selected embodiments, the apparatus 10 may include an input device 24 for receiving inputs from a user or from another device. Input devices 24 may include one or more physical embodiments. For example, a keyboard 26 may be used for interaction with the user, as may a mouse 28 or stylus pad 30. A touch screen 32, a telephone 34, or simply a telecommunications line 34, may be used for communication with other devices, with a user, or the like. Similarly, a scanner 36 may be used to receive graphical inputs, which may or may not be translated to other formats. A hard drive 38 or other memory device 38 may be used as an input device whether resident within the particular node 12 or some other node 12 connected by a network 40. In selected embodiments, a network card 42 (interface card) or port 44 may be provided within a node 12 to facilitate communication through such a network 40.

In certain embodiments, an output device 46 may be provided within a node 12, or accessible within the apparatus 10. Output devices 46 may include one or more physical hardware units. For example, in general, a port 44 may be used to accept inputs into and send outputs from the node 12. Nevertheless, a monitor 48 may provide outputs to a user for feedback during a process, or for assisting two-way communication between the processor 14 and a user. A printer 50, a hard drive 52, or other device may be used for outputting information as output devices 46.

Internally, a bus 54, or plurality of buses 54, may operably interconnect the processor 14, memory devices 16, input devices 24, output devices 46, network card 42, and port 44. The bus 54 may be thought of as a data carrier. As such, the bus 54 may be embodied in numerous configurations. Wire, fiber optic line, wireless electromagnetic communications by visible light, infrared, and radio frequencies may likewise be implemented as appropriate for the bus 54 and the network 40.

In general, a network 40 to which a node 12 connects may, in turn, be connected through a router 56 to another network 58. In general, nodes 12 may be on the same network 40, adjoining networks (i.e., network 40 and neighboring network 58), or may be separated by multiple routers 56 and multiple networks as individual nodes 12 on an internetwork. The individual nodes 12 may have various communication capabilities. In certain embodiments, a minimum of logical capability may be available in any node 12. For example, each node 12 may contain a processor 14 with more or less of the other components described hereinabove.

A network 40 may include one or more servers 60. Servers 60 may be used to manage, store, communicate, transfer, access, update, and the like, any practical number of files, databases, or the like for other nodes 12 on a network 40. Typically, a server 60 may be accessed by all nodes 12 on a network 40. Nevertheless, other special functions, including communications, applications, directory services, and the like, may be implemented by an individual server 60 or multiple servers 60. Processes and steps herein may be implemented in modules executing on a processor 14.

In general, a node 12 may need to communicate over a network 40 with a server 60, a router 56, or other nodes 12. Similarly, a node 12 may need to communicate over another neighboring network 58 in an internetwork connection with some remote node 12. Likewise, individual components may need to communicate data with one another. A communication link may exist between any pair of components. Modules in memory 16 may execute any steps on processors 12.

Figure 2:
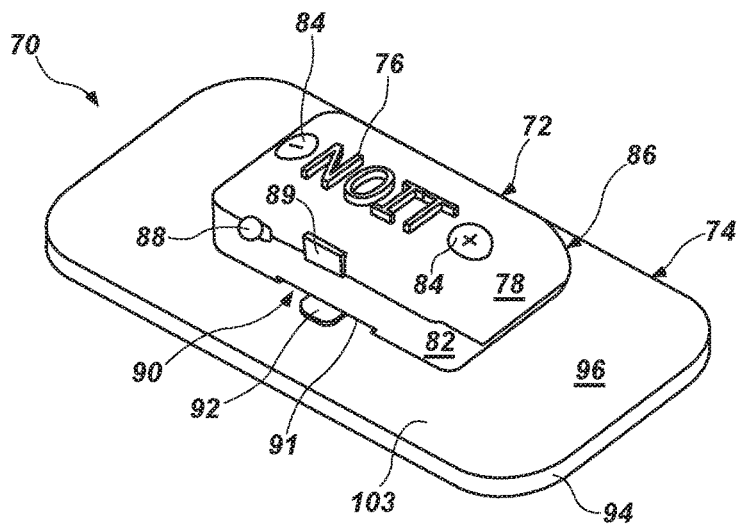
FIG. 2 is a rear perspective view of one embodiment of a Natural Orientation Induction Tool (NOIT) system, where front, back, top, bottom, right, and left are viewed from the perspective of a wearer.

Referring to FIG. 2, a Natural Orientation Induction Tool (NOIT) 70 has been the subject of field testing for the research group of parents and severely autistic children. The unit is very light weight and can easily be placed on the child's back, or worn under clothing, in a place where it is not likely to be dislodged by the child's other movements.

All the conclusions concerning the effectiveness and use of any system cannot be made until many events and years of experience have been completed. Nevertheless, the systems have 70 been found by many subjects 136 (wearers 136) and their caregivers (operators), who typically operate the NOIT, to provide substantiation of the theory and operation. For example, subjects who cannot be oriented through instruction or are not ready to work with a facilitator, may wear the NOIT device and play back a tone to the wearer 136 (subject 136).

For example, a parent will typically allow a child to wear the NOIT 70 for as long a period in each day as the child is willing to permit. In some embodiments, the NOIT 70 may project music over a tone. Nevertheless, in a most energy efficient configuration, the system 70 need only generate a periodic tone. That is, a tone must be delivered to a child in a way that its apparent position can be sensed consistently, regardless of the location or position of that wearer 136. It does not suffice to play the tone externally, such as over speakers in a room. If a child is in a room, then movement of the child changes the relative location from which the tone emanates.

In order for auditory orientation to work, a source of sound must remain the same in relation to the child and the child's perception, regardless of which way the child turns. Thus, it has been found that it is possible for a person to hear sounds, clearly and accurately, without relying on a device attached to the ears. Hearing is initially a mechanical process that results in the neural signal to the brain received from a mechanical system of tiny bones connected to the eardrum in the ear. Those bones, connected to the ear drum, convert vibrations in the surrounding air through motion, transmitted by the drum into the series of bones.

Vibrations need not come from surrounding air to the surface of the ears. In certain embodiments of an apparatus and method in accordance with the invention, an electronic device may be sized to be about the size of a portable MP3 player. A pair of transducers function similarly to speakers.

The system 70 is attached to a small, adhesive pad 94, which can be affixed to the skin 139 of a person's body. Sound vibrations are then transmitted through surrounding air, as well as through the skin and body. An individual has the sense of being surrounded by the sound. As the sound volume is low and the tone is intermittent, this has not shown to be an overwhelming experience for the autistic subject 136. It is simply an alternate way to enable the child 136 to hear a single repeated tone from a consistent location (relative to the user 136) in a consistent way.

The NOIT 70 or system 70 includes the driver 72 and an actuator 74. The driver 72 has the function or responsibility to provide the timing, inputs, receive controlling inputs, setting up the tone, the frequency of repetition, the delay time therebetween, and so forth. In certain embodiments, the frequency of the tone may be preselected and may be limited in a particular system 70 to a single frequency.

Meanwhile, the frequency of repetition of the intermittent tone may be preselected, may be modified, and may be made in steps. For example, in one embodiment, the tone is played for less than a second, in others for seven seconds as its volume decays, and is repeated every eight seconds, or other time.

Meanwhile, the delay time may be set to last from one to eight seconds, or multiples of eight seconds. However, a user, such as a caregiver, may reset the repetition frequency to repeat at multiples of eight seconds or another increment, such as within sixteen seconds, thirty two seconds, twenty four seconds, and so forth.

In the illustrated embodiment, the driver 72 is provided with a label 76, which may be useful to the reader herein as an indicator of the orientation of the system 70 in the various figures. A top 78 or back 78 of a case 80 may have the label 76 printed thereon, or molded therein.

In general, the case 80 may be formed of a top 78 (or back 78) and a bottom 82, base 82, or front 82. Various buttons 84, 86, 88 may be provided for operation by a user. For example, a button 84 may be used for decreasing the volume of the sound, or altering the operational mode of the system 70. Similarly, the button 86 may be used to increment up the volume of the sound signal, the timing of the signal, or alter the mode of operation thereof. Of course, other buttons 88 may be provided, such as a power button 88, or button 88 for other functionality. Likewise, the buttons 84, 86, 88 may be used in combinations in order to accomplish various other functionality.

For example, clicking a button 88 may turn the power on or off. Holding a button 88 may instead change the functionality of the buttons 84, 86, or both. Likewise, holding the button 88 may turn the power on or off, depending on the condition at the time the button 88 is pressed. In such an embodiment, clicks, whether short single clicks, multiple clicks, or the like, may be used to transition to various other functionalities or to change the operation of the buttons 84, 86.

In certain embodiments, the apparatus 70 or system 70 may be provided with a port 89, such as a standard USB port. Accordingly, programming of the system 70 or system 70 may be done on an external computer system 12 which may then treat the system 70 as simply a peripheral or an appendage. Typically, a computer 10 may access the system 70 in order to read information, write information, install programs, download or upload data, or any combination thereof.

In other embodiments, an entire computer may actually be built into the driver 72 of the system 70. In certain embodiments, visual displays, data processing, representations of information, and the like may be provided by software programmed into a computer 12, and executed based on data downloaded through the port 89 to or from the driver 72.

A mount 90 may provide mechanical, electrical, electronic, or combination interface 90 to connect the driver 72 to the actuator 74. One benefit of a mount 90 is the ability to replace damaged or worn components. For example, in the illustrated embodiment, a receiver 91 is formed as an opening in a case 88 of the driver 72. The mount 90 is secured by gluing, bonding, or other fastening mechanism to or as part of the backer 96 or substrate 96. Typically, a tab 92, forming a part of the mount 90 may be used to release the driver 72 from engagement with the mount 90. Accordingly, a relative sliding motion initiated between the driver 72 and actuator 74 by a user may remove the driver 72 from the mount 90, and thus from the backer 96.

Figure 3:
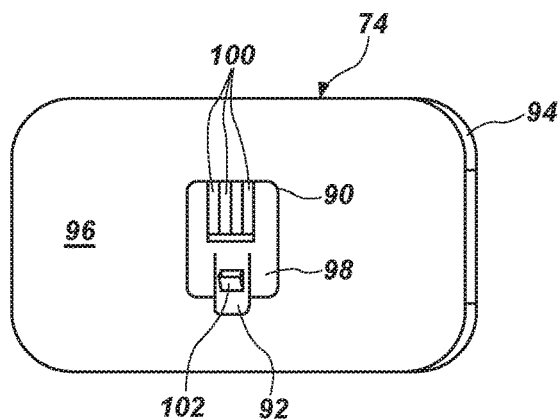
FIG. 3 is a rear perspective view of one embodiment of the basic actuator portion or actuator assembly thereof.

Referring to FIG. 3, the system 70, upon removal of the driver 72, leaves behind the actuator 74. The rail 90 or mount 90 is shown secured to the actuator 74. In certain embodiments, one may think of a mount 90 as a part of the actuator 74. For example, the mount 90 provides an attachment that can used for securing the driver 72 to the actuator 74 in order to form a system 70.

The base 98 of the mount 90 may be configured to leave the tab 92 freely extending from the mount 90, and spaced away from the backer 96 of the actuator 74. In this embodiment, the driver 72 may slide along the mount 90 parallel to the actuator 74, until engaging a latch 102 of the tab 92. Release of the driver 72 may be effected by depressing or otherwise moving the tab 92, thereby moving the latch 102 out of a matched receiver 91 or recess 91 in the case 80 of the driver 72.

The mount 74 may have contacts 100 effective to make electrical contact with the power and electronics within the driver 72. The contacts 100 permit transmission of power, data, voltage, signals, or a combination to the actuator 74. In some embodiments, the actuator 74 may include no intelligence or processing, and may receive only power. Nevertheless, it may be advisable to, at a minimum, monitor activity or control of the actuator 74.

The mount 90 is shown secured to the surface 103 of the backer 96. This may be thought of as the outer surface 103 of the backer 96. Opposite the surface 103 of the backer 96 is a gel pad 94. The gel pad 94 may be constituted by various components, including a rubber-like, polymeric gel treated with an adhesive, or an actual gel embedded in a or other matrix and having adhesive properties.

The functions of the gel pad 94 or pad 94 include transmission of mechanical vibrations as transmitted sound from the backer 96 to the skin and skeletal structure of a subject. Likewise, the pad 94 may be configured to be easily conformable and comfortable for wear by a wearer (subject).

Figure 4A:
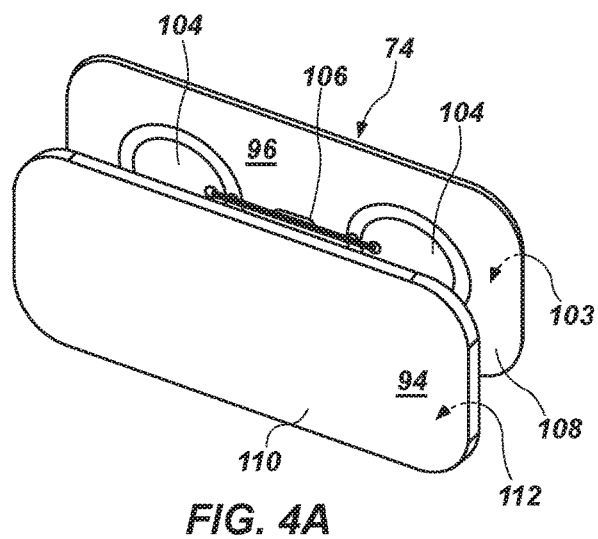
FIGS. 4A and 4B are rear, perspective, exploded views of alternative embodiments thereof.
Figure 4B:
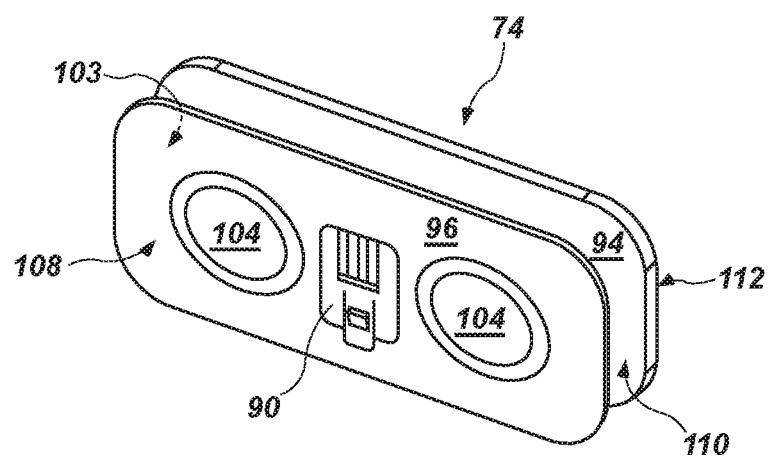

Referring to FIGS. 4A and 4B, an exploded view of the actuator 74 illustrates the pad 94 having been separated and offset from the backer 96. This renders visible the piezoelectric transducers 104 integrated into the backer 96. Typically, wires 106 are connected through the backer 96 to the contacts 100 of the mount 90.

Thus, a voltage wave applied to the piezoelectric transducers 104 causes a vibration dictated by the frequency of the change in voltage introduced by the wires 106 to the transducers 104. The transducers 104 may be attached on an outer surface 103 or an inner surface 108 of the backer 96, or may actually be formed therein or thereon as a manufacturing technique. The transducers 104 in turn, may vibrate against the surface 112 of, and thus through, the gel pad 94. Alternatively they 104 may be embedded with a gel and be more directly in contact with the skin of a wearer.

Meanwhile, the surface 110 of the pad 94 is provided with adhesive. The adhesive on the surface 110 of the pad 94 may be the gel from which the entire pad 94 is made. In alternative embodiments, a rubber-like gel (as opposed to a thixotropic or other true gel), may have dimensional stability, and yet flexibility, including compressibility. Thus, an adhesive layer on the surface 110 may secure the pad 94, or may effect securing the actuator 74 to the back of a subject (wearer).

Figure 5:
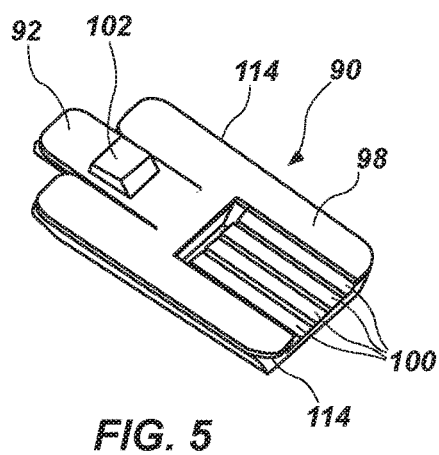
FIG. 5 is a top, rear, perspective view of details of the mount from FIG. 3.

Referring to FIG. 5, the rail 90 or slide 90 may include several functional features, including the release tab 92, which, when pressed, moves the latch 102 downward, that is, into the page, as illustrated. This moves a latch 102 out of a detaining position in the bottom of the driver 72, permitting release, and a parallel sliding motion of the driver 72 from the actuator 74.

In the illustrated embodiment, a specific shape may be formed on the edge 114 of the base 98 of the rail 90 or mount 90. In the illustrated embodiment, the edge 114 is simply tapered such that it forms a slide 114 and may be received into a matching shape. For example, the edge 114 may be formed to be convex, while a concavity in a matching slot will receive that edge 114 into the driver 72.

Figure 6:
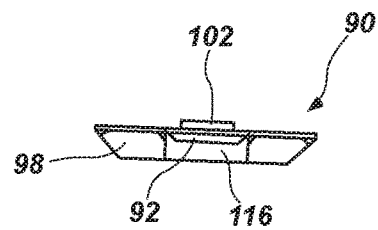
FIG. 6 is a bottom, end, plan view thereof, showing the tab and latching.

Referring to FIG. 6, the edge 114 is illustrated to operate much as a "way" or "slide" of a machine tool, such as a lathe. By tapering the edge 114, tolerances may be relaxed, while precision may still be achieved to the degree necessary. In the view of FIG. 6, the relief 116 or space 116 below the tab 92 illustrates the space 116 into which the tab 92 may be moved upon being depressed by the finger of a user.

Meanwhile, the latch 102 is seen protruding from the tab 92, as a catch 102 to retain the mount 90, and thus the actuator 74 securely to the driver 72.

Figure 7:
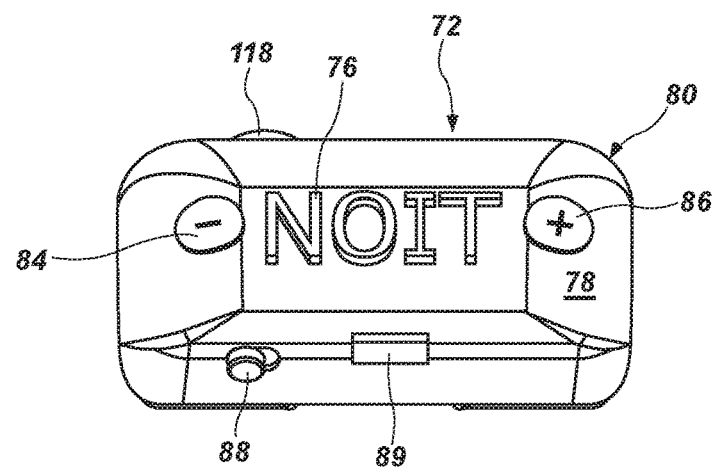
FIG. 7 is a rear, elevation view of the driver that connects (by the mount) to the actuator to form the Natural Orientation Induction Tool (NOIT) of FIG. 1.

Referring to FIG. 7, the rear view of the system 70 is taken from the orientation of the system 70 sitting on a vertical surface, such as a back of a user. In reality, the view represents a more vertical than a true back view, if considered from the point of view of the wearer (subject). In this embodiment, the rear 78 of the case 80 is seen in an assembled configuration, of the driver 72, with the actuator 74 absent. Thus, the physical module 72 that constitutes the driver 72 may be removed from the actuator so the actuator 74 can be serviced or replaced, the driver 72 can be programmed, and so forth. Thus, one may rely on an external computer 12 operating through the USB port 89 to program a driver 72. One may then simply hand the driver 72 to a user to be combined with an actuator 74 as a system 70. Thus, the actuator 74 may be a disposable device in certain embodiment.

In other embodiments, the actuator 74 may simply have the adhesive pad 94 replaced or renewed. For example, the substrate 96 may be formed of a flexible but strong polymeric material, such as a plastic. Polyethylene, polypropylene, PET (polyethylene terephthalate, sometimes known by trade name Mylar™), or the like may serve well. Thus, the entire pad 94 may be stripped off the backer 96.

In other embodiments, the pad 94 may be formed of a very compliant, soft, rubber material, whether synthetic or natural. This material may form to the pad 94 to have a sufficiently low durometer rating as to be highly compliant, and very comfortable. Added to this, the surface 110 may receive an adhesive. In other embodiments, the entire pad 94 represents an adhesive hydro gel. That is, certain materials will absorb substantial water, and become tacky to the touch. Thus, a hydro gel adhesive may form the entire pad 94, the adhesive on the surface 110, or the like.

In certain embodiments, a loop 118 may be formed as part of the case 80 in order to secure the system 70 against being dropped, lost, damaged, or the like. The loop 118 may be replaced by a lanyard directly connected otherwise to the case 80. In the illustrated embodiment, the loop 118 is sized to easily receive a lanyard or tether that may then be secured to an article of clothing, or the like to secure against separation, dropping, or other loss.

Figure 8:
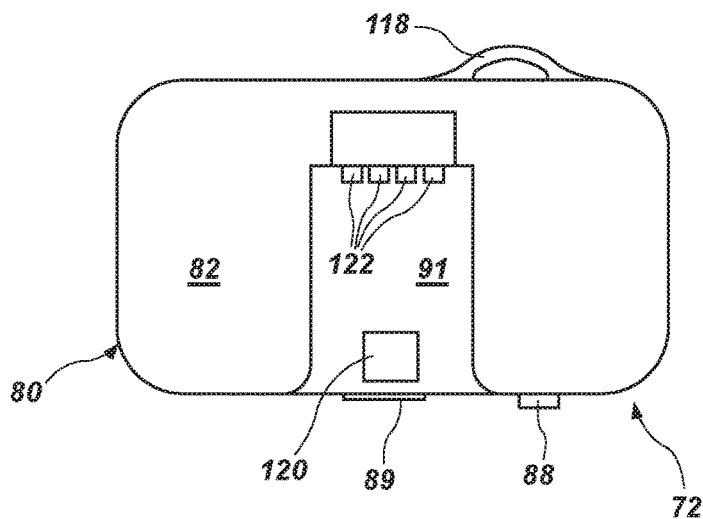
FIG. 8 is a front, elevation view thereof.
Figure 9:
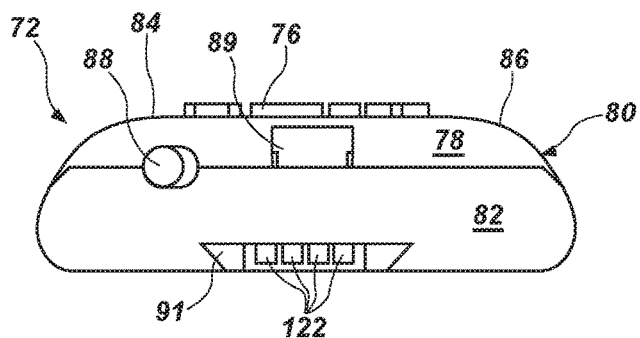
FIG. 9 is a bottom, plan view thereof.
Figure 10:
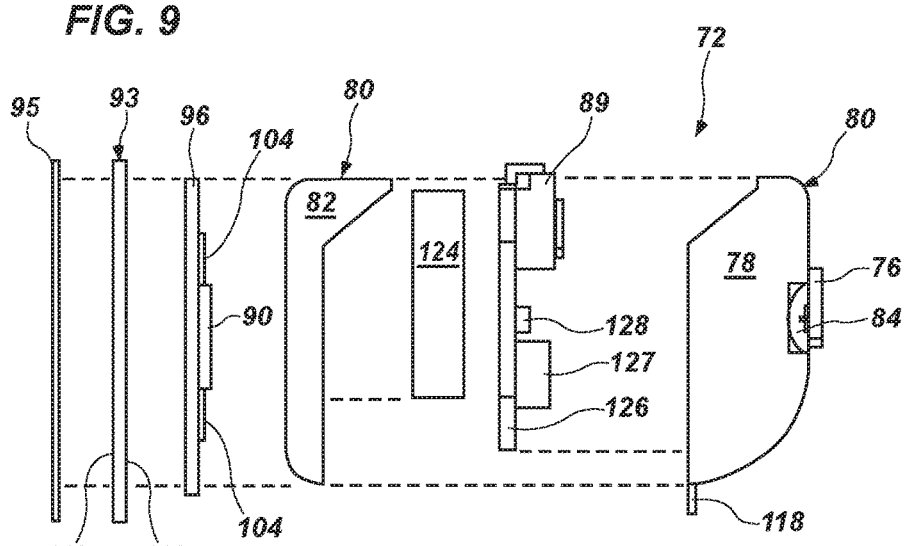
FIG. 10 is a left, side, elevation, exploded view thereof.

Referring to FIGS. 8-10, the driver 72 may be provided with a slot 91 or receiver 91 shaped and sized to receive the rail 90 or mount 90 secured to the backer 96. A sliding motion of the driver 72 with respect to the actuator 74 may engage the rail 90 in the slide receiver 91.

An aperture 120 may be formed as a recess, or a blind hole within the material of the base 82 or front 82 of the case 80 of the driver 72. In other embodiments, the aperture 120 may be a through hole passing all the way through the material of the base 82 of the case 80.

A tapered edge on the latch 102 may depress the tab 92 as the relative motion between the rail 90 on the backer 96 of the actuator 74 continues with respect to the case 80 of the driver 72. Accordingly, the tab 92 will depress, the latch 102 will be permitted to pass under the aperture 120, until the latch 102 may snap back up into the aperture 120, thus locking the rail 90 and actuator 74 against removal from the driver 72.

This sliding motion also places into contact with one another, the electrical contacts 100 on the mount 90 or rail 90 against contacts 122 on the driver 72. Thus, the driver 72 may pass electrical signals and current through the contacts 122 into the contacts 100, and thus into the transducers 104 of the actuator 74.

Referring to FIG. 10, while continue to refer to FIGS. 7-10, and FIGS. 1-12 generally, a case 80 may house various components for providing power and signals to the actuator 74. In the illustrated embodiment, the base 82 or bottom 82 of the case 80 may house a battery 124. The battery 124 may be electrically and mechanically connected to a circuit board 126. The circuit board 126 may include any amount of intelligence, from a simple switching function to frequency generation of power signals, to power transfer, or complete processor logic. The circuit board 126 may thus include various chips, connectors, pathways, and so forth as discussed hereinabove.

In one embodiment, the electrical connections may be formed by contacts, while in other embodiments, wires may complete connections. Typically, the port 89 may be mounted to the circuit board 126. All electronics and electrical connections with systems outside the case 80 maybe made mechanically with the circuit board 126, as well as electrically. For example, the contacts 122 may simply be represented by a portion of the circuit board 126 exposed in the slot 91.

A tactile button 128 may fit on a circuit board 126 under each of the buttons 84, 86. In this way, the circuit board 126 may be contacted or engaged directly, by a simple touch to the buttons 84, 86, which may simply be mechanical, flexible tabs 84, 86, formed as part of the case 80.

The back 78 or cover 78 may be separated from the base 82 or front portion 82 in order to replace the battery 124 periodically. In other embodiments, the port 89 may be accessed in order to recharge the battery 124 from a device, such as a computer, transformer, or power supply external to the system 70. In other embodiments, the system 70 may include a power supply connectable to the port 89 for the specific purpose of recharging.

Meanwhile, the port 89, if configured as a USB port may receive both charging power for the battery 124, as well as information being downloaded to or uploaded from the system 70, including programs or data being uploaded or download to or from the system 70 to a computer for processing.

Figure 11:
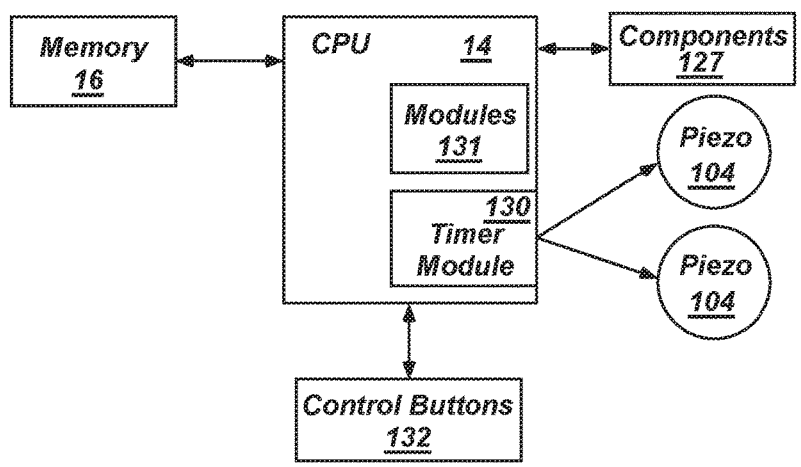
FIG. 11 is a schematic block diagram of the piezoelectric transducers controlled by modules executing on a processor in accordance with operator controls.

Referring to FIG. 11, in one embodiment of the system 70 in accordance with the invention, a processor 14 may be mounted to the circuit board 126. That processor 14 may be provided with memory 16 operably connected therein by any mechanism known in the art, or as described hereinabove. Meanwhile, the processor 14 may execute a timer module 130 providing timing.

Typically, the timer module 130 may operate off a clock in a processor 14, thereby operating to control the transducers 104 in accordance with controls input by various control buttons 132. For example, as described hereinabove, the buttons 84, 86, 88 may be used individually, or together, or both as the control buttons 132 in order to program the processor 14. The timer module 130 may execute controls delivering to each of the piezoelectric transducers 104 a signal (e.g., waveform) causing a cyclical mechanical motion inducing vibration transmitted through the pad 94 to a user 136.

An example of program flow in one embodiment of a CPU 14 or the like in a driver 72 (controller 72) in a system 70 may meet the overall purpose of the program to produce a repeated sound at a selected volume and with a selected time interval between repetitions. The program performs several functions simultaneously: 1) monitor control buttons 132, 2) when playing sound, transfer audio data from a memory 16 to a timer 130 to produce the output waveform, and 3) when not playing sound, keep track of the time delay to determine when to start playing the next repetition of the sound. In addition to the repeated sound, the program may select other sounds to play, in order to provide audio feedback to the user to confirm the user's operation of the control buttons.

In one embodiment, two control buttons 84, 86. When pressed one at a time, increase or decrease the volume, respectively. This is confirmed by the system 70 outputting a spoken number from 1 to 7. When both buttons 84, 86 are pressed simultaneously, the system 70 enters a delay-selection mode. The next delay is selected automatically. The selection is confirmed by the system 70 outputting a voice saying "Delay" and a number corresponding to the length of the delay. Pressing a certain combination of the buttons 84, 86 will increase or decrease the delay. The sound is decaying after about one to two seconds to silence at approximately seven seconds. The delay intervals are selected so that there is a multiple of 8 seconds between initiation of the sound. So the shortest delay plays the sound every 8 seconds, with almost no delay. The next-shortest causes the sound to be played every 16 seconds. Then, 32, 64, 128, 256, and 512 seconds.

Information about volume and delay is stored in non-volatile memory 16 so that the system 70 is in the same mode after it is turned off and back on.

In one implementation, the CPU's timer module has a comparison function. The timer is set to repeatedly count from 0 to 255, and will change the state of output wires depending on whether the timer value is either higher or lower than a configured value. The timer completes each counting cycle approximately 40,000 times per second (every 25 microseconds). During that time, the next value to be configured is read out of non-volatile memory and written to the timer.

Thus, sound encoded by a series of numbers (e.g. the "RAW" output type of music editing software) will produce a pulse-width-modulated output where the width of each pulse is proportional to the number. The circuit thus implements the output stage of a Class D amplifier. Volume change may be implemented simply by storing multiple copies of the sound at different volumes.

Two timers may be used in order to produce two-channel output. Each timer has two output wires configured to produce the inverse waveform of each other. The output signal on those pins is used to directly drive piezoelectric transducers 104 (discs 104) through a resistor.

In certain embodiments, the circuit board 126 may be implemented as a comparatively simple circuit with certain control elements and logic in order to execute its various functionalities. For example, in one currently contemplated embodiment, the circuit board 126 may include various components including a processor 14, memory 16, controller software, and the like. As a practical matter, the various modules 130 may include more than a timer module 130, but may include various modules for accomplishing various functionality.

For example, the computer 12 of FIG. 1 may be completely implemented on the circuit board 126 and peripheral equipment or components connected thereto. The components 127 may include any or all of the functionalities identified with respect to the computer 12 of FIG. 1. Multiple processors 14, various types of memory 16 from a hard drive 18 to ROM 20, RAM 22, and the like may be encased within the case 80 and associated with the circuit board 126 and peripherals operationally connected thereto.

For example, the port 89 may include access to output devices 46, or various output devices 46 may be included within the components 127. Moreover, various input devices 24 or access to such input devices 24 may be included on the circuit board 126, or connected operably thereto. Thus, access to a network 40 through a network card 42 and in accordance with the required protocols may be implemented in order to connect the system 70 to include the network 40, other networks 58, additional nodes 12, routers 56, servers 60, and so forth.

The system 70 may be programmed directly at manufacture. Alternatively, the system 70 may be programmed and reprogrammed at will through the port 89 or a network card 42, or the like over a network 40 or directly through a computer 12 on board. Similarly, data may be downloaded through the port 89, network card 42, or both, in both directions to and from the system 70.

The components 127 may be augmented by modules 131 in order to implement programming of the system 70 to control operation thereof, updating information, schedules, control parameters, and other data, or to download recorded information such as operation times, delays, usage times, and so forth.

In certain embodiments, the piezoelectric transducers 104 may also operate in reverse (as sensors) periodically in order to record or sense motions of a user 136. Similarly, various components 127 may include motion detection devices, the outputs of which may be processed by the programmed instructions of various modules 131 in order to ascertain motion, speed, acceleration, and the like indicating activities of a user 136. From these activities, and the recordings of such information, automatic or self-stimming activities, calm, sleep, normal motion, and the like may actually be detected.

Thus, in certain embodiments, the functionality programmed into the modules 131 executing in the CPU, and stored in various memory devices 16 may provide programming, instructions or controls to the apparatus 70, and collection of data regarding a user 136, the apparatus 70, or both over some period of time. By connecting through a port 89, network card 42, or other port 44, another computer 12 connected to the computer 12 of the apparatus 70 may interact to provide programming, provide information, provide analysis, or download data collected thereby.

Thus, one may think of the system 70 as including a circuit board 126 or the like that implements and forms the central hardware of a computer 12 as illustrated in FIG. 1. This computer 12, on the circuit board 126, and connected peripherals or other components 127 may thus implement any of the functionalities in any of the structures identified in the computer 12 of FIG. 1. Similarly, through a port 89, network card 42, or the like, the system 70 may communicate information out, information in, analysis, and the like in order to implement uploads of data, data collection, control, programming, and the like.

The sound itself to be replicated by the system 70 has been recorded in a special way so that the sound does not appear to be coming from the speaker (transducer) 104. The sound is originally recorded as a tone much like that of a bell as used in a bell choir. The tones are audible, mild, penetrating, and decay over time.

In one embodiment, the time period between tones may be set at a value of from about three to about twenty seconds. An effective target value is about eight seconds. During the time period of the tone, the tone is reproduced at about its maximum value for from about one half to about two seconds. A target value is about one to one a half seconds. In one currently demonstrated embodiment, the sound appears to generate at its maximum volume, (set by an operator) for about a target value of one and one half seconds. Thereafter, the sound decays out to a time of about seven seconds after initiation. Thus for a periodicity of eight seconds, approximately one second of complete silence persists before the sound is repeated.

In recording sound, one objective is to provide the artifacts or features of the sound in such a way that they appear to be the same as if they had been experienced through a set of stereo headphones. Thus, beyond "stereo" effects, even effects that cannot be known nor understood are replicated by physical modeling. For example, notwithstanding the piezoelectric transducers are not located at the ears, the various artifacts of the sound may be so generated by recording them as if they were heard at the ears of a person.

Specifically, a model of the upper part of the body, such as the shoulders, neck, and head of a user may be replicated in a material that is synthetic, but provides approximately the same sound attenuation (e.g., deadening) as the human body. For example, a model of plastilene clay was created, including the shape of the head and the shape of the ears. Recording devices were placed at a position corresponding to an eardrum in each ear. Thus, sound generated had to pass around the head, reflect from the outer ear, and propagate down through the ear canal to the location of the eardrums. At the location of the eardrums, recording microphones were placed to record the sound waves received.

Sound was generated behind the model head, and above the line of sight. Thus, all artifacts, known and unknown, of the recorded sound corresponded to what the ears would detect upon hearing a sound generated above and behind the head of a user.

When the sound is played back or regenerated by the piezoelectric transducers, the artifacts of that sound imposed by the geometry of the head, of the position of the sound generator (e.g., bell tone), and the relative position of all the constituents including the eardrums, ear canal, and geometry of the head, and so forth, result in a sound wave received by the microphones at the eardrum locations having considerable complexity, which has been accommodated by the details in the physical modeling.

Thus, upon regeneration of the sound, all its artifacts exist to an extent sufficient to affect the mind of a hearer, or the interpretation by the mind of a hearer, at the location originally sourced for the sound. Stated another way, due to the artifacts of the sound waves detected at the location of the eardrums, the perception of the mind upon a replay or regeneration of the sound is that the sound seems to originate from behind the head above the line of sight.

A sound file is created that generates a sound in a manner to make it appear to a subject (user) 136 as if the sound were coming from somewhere else. Part of this process amounts to creating a stereophonic sound. Stereophonic sound is created by using multiple speakers. However, sonic waves 137 are also propagated directly into the body where they may be sensed.

Here multiple piezoelectric transducers 104 oscillate at frequencies that are within the audible range of frequencies. In this way, the actual piezoelectric transducers oscillate at a frequency that generates a sound wave that may be heard.

On the other hand, the piezoelectric transducers 104 may also be mounted so that at least one surface of each propagates in a sound and motion transmissive medium (e.g., water-based gel, a thixotropic material) that substantially eliminates air. For example, an adhesive may be formed against, around, or both with respect to the piezoelectric transducers. This gel also adheres to the skin of a user.

Typically, the location of the NOIT 70 is near the top of the shoulder blades as to vertical location, and centered across the spinal column with respect to horizontal position. In this position, the piezoelectric transducers 104 not only produce an audible sound that a wearer (subject, user) can hear through the ears as transmitted through airborne sound, but also transmitted through the carrier (primarily water through the gel and through tissues) to the bodily structure, including skeletal structure, of the wearer 136.

Sound produced by the piezoelectric transducers 104 is stored in an electronic file. Some version of that signal is stored in a file in such a way that it may be reproduced by manipulating the voltage (modulating the voltage) applied to the piezoelectric transducers 104.

A digitized version of recorded sound from the bell or chime source is eventually translated into signals stored in a memory 16. A processor 14 may read the digital file and control driving of the piezoelectric discs 104 or piezoelectric transducers 104. These may be configured as comparatively thinner (on the order of under 1/16 inch) discs of comparatively larger diameter (on the order of about 1 inch diameter). This size is effective in order to reproduce the generation of frequencies corresponding to the original sound 137. The piezoelectric transducers 104, on the other hand, not only produce an audible sound, but also produce compression waves or pressure waves in the adhesive gel 94. That sound 137a or sonic waves 137a may then be transmitted directly into the skin 139, tissues 138, and skeletal structures of a user 136.

In certain embodiments, a NOIT 70 may include a comparatively simple circuit board 126. For example, instead of a continuous volume control, a button 84, 86 may permit a person (e.g., facilitator, caregiver, administrator, etc.) to simply select one of various values of volume. Typically, volume may be set in steps, each incremented to increase the volume linearly. In other embodiments, the volume may be increased in a binary format, with each volume setting being twice as great as the next volume lower. Thus, an initial volume having a comparative value of unity may be doubled repeatedly to become up to the seventh or other power. One embodiment of the NOIT 70 adjusts from unity up to a maximum at a seventh level. In one currently implemented embodiment, a maximum and minimum acceptable level may be selected, and subdivided such that the lowest level corresponds to unity and the maximum level corresponds to two to a power of seven. It has been found that having more than seven levels is not necessary. However, more options may be provided.

The timing between subsequent transmissions of sound and tactile stimulus may be set at a variety of values. It has been found that a target value of about eight seconds seems to work best. Times less than about four or five seconds do not appear to be as effective. Times greater than 10 or 12 seconds do not appear to be as effective initially. However, later, extended times may place the sound signals several minutes apart. For example, over time, as natural orientation of an individual 136 occurs, an individual subject 136 (user, listener) may not need the NOIT 70 signal as frequently to obtain or maintain orientation. Thus, as a weaning process begins, the delay time between subsequent or adjacent stimuli 137 may be extended. It has been found that these may best be accomplished in a binary fashion. Thus, the target value of about eight seconds has been found suitable for a first level of delay. A second level of delay doubles the original level of delay. The next level doubles the former, and so forth. Thus, up to about two to the sixth or even eighth power may be used as a multiplier for extending the delay between adjacent initiations of the generation of the sound.

The NOIT 70 appears to work by itself. Therapy in working with learning disabled subjects 136 (wearers 136) may then take advantage of the natural orientation provided by the NOIT 70. The stimuli 137 (e.g., aural 137b and tactile 137a) of the NOIT 70 effectively appears to draw attention or "drag" the "mind's eye," to the key point about which the sound 137 appears to originate. As a direct result, the persistence of the signal, appearing inexorably and periodically, provides a respite time after which the signal repeats. The persistence itself, not overly intrusive, but ever present, appears to provide an orientation of attention, the mind's eye, that includes the perception by the user 136 of the individual presence of that wearer 136 along with a more accurate and orderly perception of the other stimuli perceived by all the senses in the normal course of life.

Figure 12:
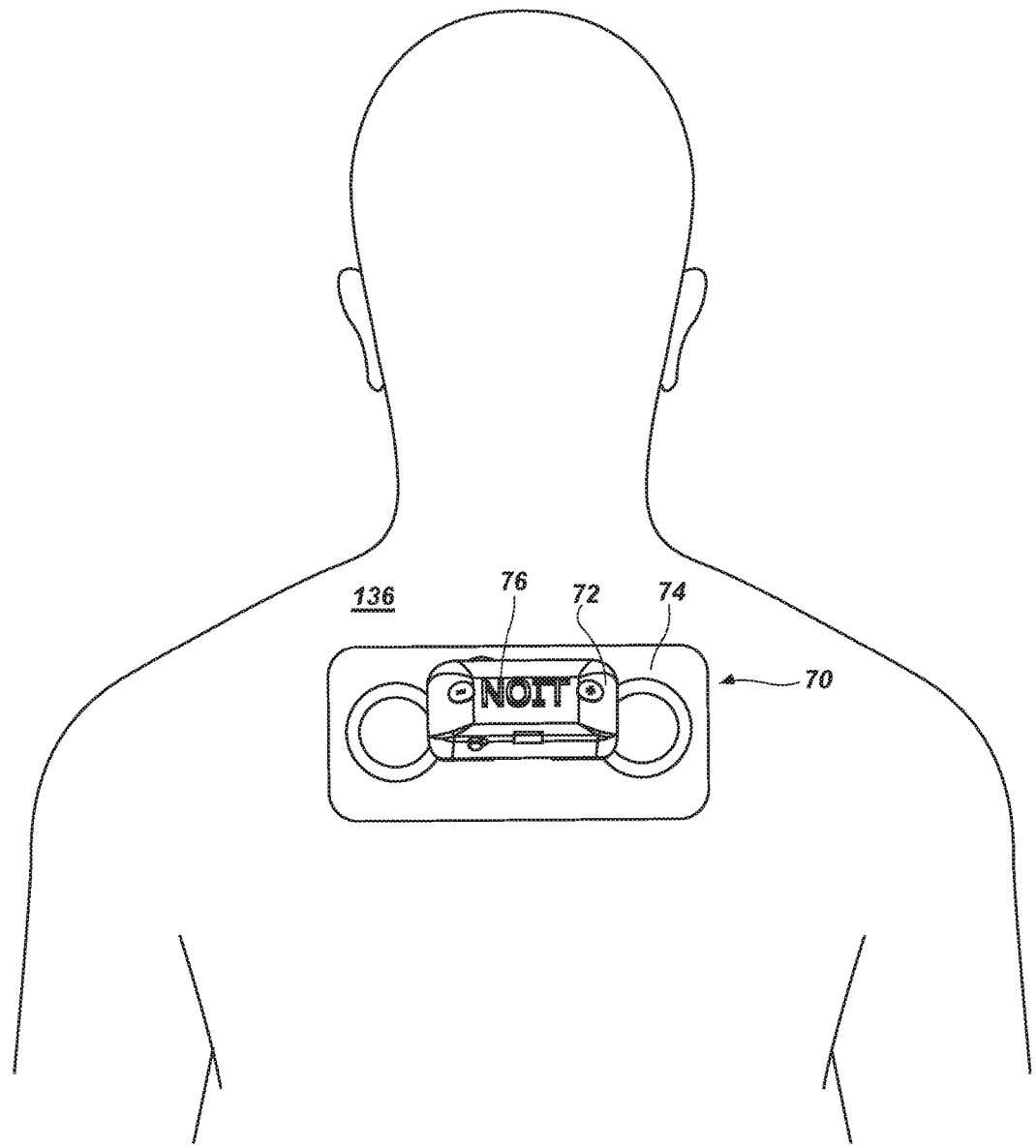
FIG. 12 is a rear elevation view of the Natural Orientation Induction Tool in place on the back of a subject.
Figure 13:
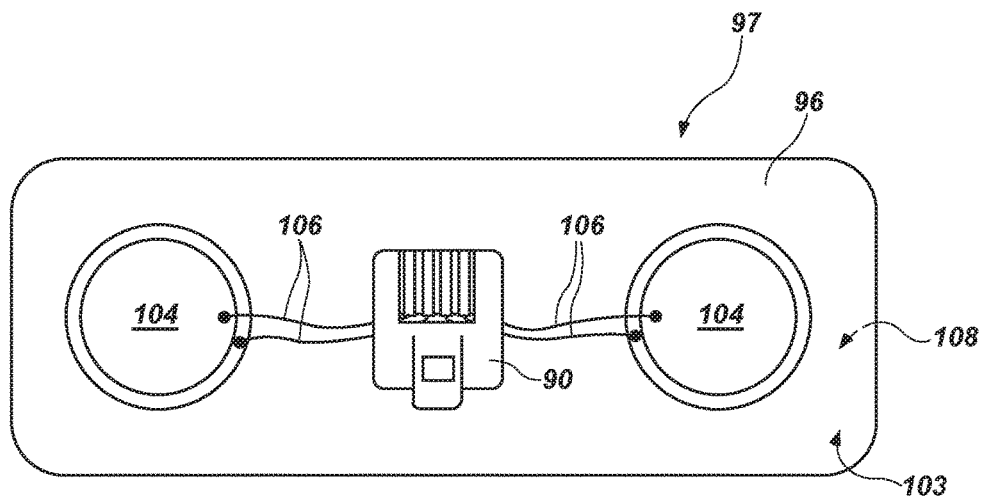
FIG. 13 is a rear, elevation view of the actuator assembly.

Referring to FIG. 12, a subject 136 is shown, with a system 70 installed slightly below the collar of the subject 136. In this embodiment, the relative size and placement of the actuator 74 and the driver 72 can be seen as not trivial, but not overly intrusive. For example, in the illustrated embodiment, the diameter of the piezoelectric transducers 104 may be from about one quarter to about 2 inches. However, it has been found that a target design of about a one inch diameter has proven effective so far in field trials.

A participant manual is used by a caregiver to a user 136 (wearer 136) in applying the system 70 to a subject 136 (user 136, wearer 136). A facilitator manual is similarly provided for a facilitator. A facilitator coordinates and directs a user or caregiver in the use of the system 70 applied to a subject 136. Accordingly, these manuals describe the processes of installation, methods of use, methods of data collection, reporting, and so forth.

Referring to FIG. 13, and FIGS. 13 through 21 generally, a system 70 in accordance with the invention may have the actuator 74 and the pad 94 or pad assembly 94, sometimes referred to as the gel pad 94 or gel pad assembly 94 configured in any of several suitable ways. for example, the piezoelectric transducers 104 may be on the face 103 or surface 103 of the substrate 96. In certain embodiments, the substrate 96 or backer 96 may be positioned between the piezoelectric transducers 104 and the gel layer 96. For example, in order to improve the transmissivity of sonic waves generated by the piezoelectric transducers 104 through the actuator 74, and into the tissues 138 of a wearer 136, it may be beneficial to place the piezoelectric transducers 104 as close to the skin 139 of a user 136 as possible. Likewise, it may be advisable or beneficial to position the piezoelectric transducers 104 as close to or within the gel layer 94 or gel pad 94 *t* eliminate intervening air.

In this embodiment, the backer 96 or substrate 96 is as illustrated in FIG. 4. Here, the piezoelectric transducers 104 are on the front face 103 or surface 103 of the substrate 96 that will contain the mount 90 interfacing with the case 80 and the circuit board 126.

Figure 14:
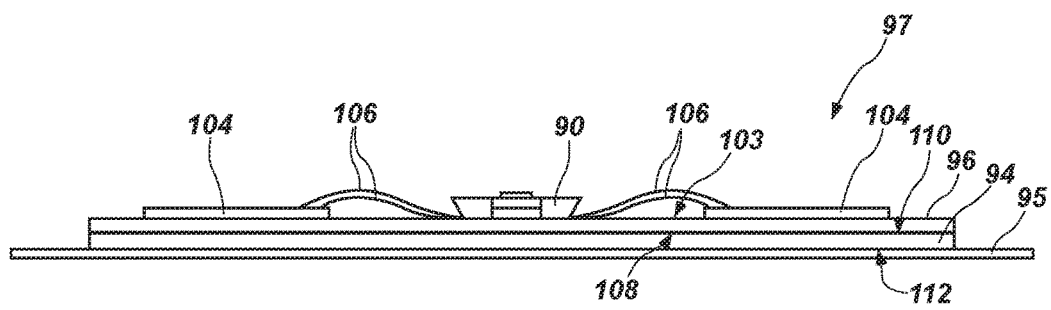
FIG. 14 is a top plan view thereof in a first embodiment presenting the piezoelectric transducers on the back surface of the substrate of the actuator assembly.

Referring to FIG. 14, a top plan view or edge view of an assembly 97 illustrates the stack up of the various components. For example, the mount 90 is secured to the backer 96 or substrate 96. Similarly, the substrate 96 may itself be formed of a compliant elastomeric material. Piezoelectric transducers 104 are secured to the backer 96, and connected to the mount 90 by the wires 106. Meanwhile, the gel layer 94 or gel pad 94 constitutes a material that is responsible to interface between the user 136 and the piezoelectric transducers 104. It may be a hydrogel gel, or the like. Typically, it should be an adhesive material, may include a composition, and may be a layer 94 treated with an adhesive on a front surface 112.

Meanwhile, a rear surface 110 may likewise be adhesive and secured to or formed into the substrate 96. Typically, a protective film 95 may be provided on the face 112 of the gel pad 94 or gel layer 94 in order to protect it and keep it fresh. For example, reducing evaporation from a water-based or hydrogel 94 may be important. Similarly, keeping dust and other materials away from the surface 112 of the gel layer 94 when not in use will typically be important as well. Thus, the protective film 95 may be applied to the gel layer 94 during the manufacturing process. It may be removed for application of the assembly 97 to the skin of a user 136, and replaced when the apparatus 70 is removed at night.

Figure 15:
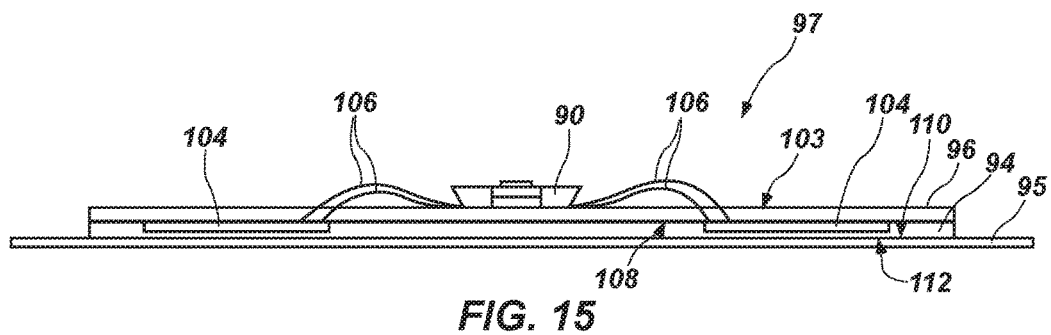
FIG. 15 is a top plan view thereof in a second embodiment presenting the piezoelectric transducers on the front surface of the substrate of the actuator assembly.

Referring to FIG. 15, the position of the piezoelectric transducers 104 may change or may be placed in a different location. For example, in this embodiment the piezoelectric transducers 104 are positioned on the front surface 108 of the backer 96. For example, in this embodiment, in order to place the piezoelectric transducers 104 both closer to the skin of a wearer 136, and in intimate contact with the gel layer 94, the gel layer 94 may actually be formed over the piezoelectric transducers 104 on the surface 108 of the backer 96 or substrate 96. In contrast, the previous embodiment placed the piezoelectric transducer 104 on the opposite surface 103 or face 103 of the substrate 96.

Figure 16:
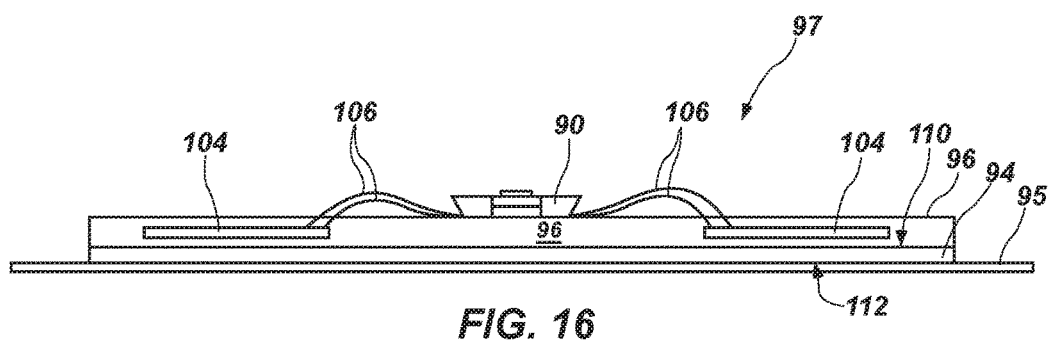
FIG. 16 is a top, plan view thereof in a first embodiment presenting the piezoelectric transducers embedded inside the substrate of the actuator assembly.

Referring to FIG. 16, in this illustrated embodiment, the cross sectional top plan view of the assembly 97 as an actuator 74 is illustrative of an embedded piezoelectric transducer 104 within the substrate 96. In this embodiment, the piezoelectric transducer 104 may actually be molded into, for example, a silicon substrate 96. This will provide intimate contact through a solid, yet flexible transmission medium constituted by the substrate 96. Meanwhile then, the gel layer 94 may be a comparatively thin layer 94 operating primarily if not exclusively as an adhesive and a contact material to transmit sonic waves 137*a* from the piezoelectric transducers 104 as received through the substrate 96.

Referring to FIGS. 13 through 16, the piezoelectric transducers 104 may be positioned on the face 103 away from a user 136, on the face 108 of the substrate 96 closest to a user 136, or embedded within the substrate 96, respectively. In any of these configurations, the layout from the rear elevation view of FIG. 13 (where directions all refer with respect to a user) may be maintained.

Only the depth or position within the assembly 97 or within the thickness of the assembly 97 need change. Of course, a suitable medium may be selected for forming the substrate 96, and particularly the gel pad 94 or gel layer 94 in order to optimize transmission of sonic waves 137*a* from the piezoelectric transducers 104 into the tissues 138 of a wearer 136.

Figure 17:
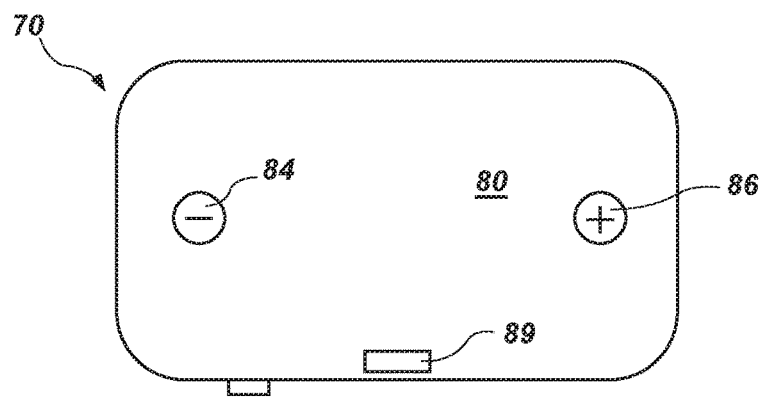
FIG. 17 is a rear, elevation view of an integrated embodiment (version) of a system in accordance with the invention, presenting the piezoelectric transducers and actuator assembly embedded or built on to the back surface of the driver.
Figure 18:
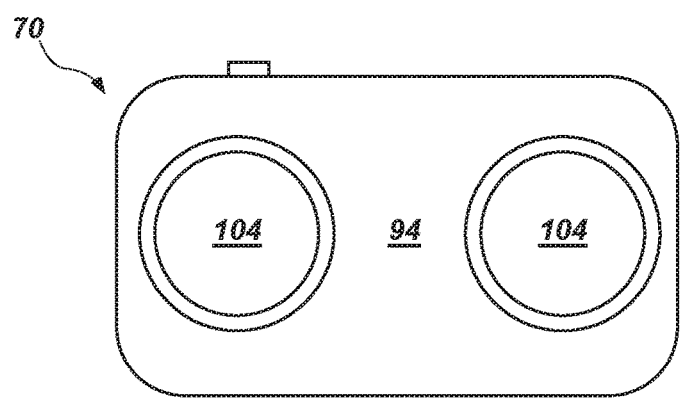
FIG. 18 is a front, elevation view thereof.
Figure 19:
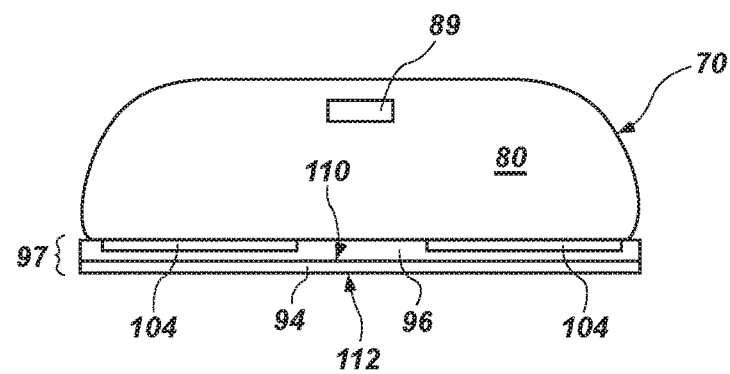
FIG. 19 is a top, plan view thereof.

Referring to FIGS. 17 through 19, in certain embodiments, the substrate 96 may degenerate (in the mathematical sense) or simplify down to a layer 96 bonded, secured, formed on, attached, or otherwise made integral with the case 80 of the system 70. In this embodiment, the piezoelectric transducers 104 may connect directly through the case 80 into the circuit board 126 of the system 70. In this embodiment, the actuator 74 as an assembly 97 becomes integral with the case 80 of the driver 72 to form the system 70.

Again, the face 112 of the gel 94 may be opposite the surface 110 which may serve as a bond with, or may simply be deposited on the substrate 96. In this embodiment, the gel layer 94 may be wiped on, spread on, applied and removed as a separate material, or the like.

Likewise, the configuration of FIGS. 17 through 19 illustrates how the overall system 70 may be potted and integrated such that it is fully immersible. The port 89 may need to be configured in an alternative configuration in order to make it seal. That is, a typical mini USB or micro USB port 89 is not waterproof. Thus, the port 89 may have to be configured in a waterproof configuration. If so, then proper sealing and potting of the system 70 in the case 80 may render the entire system 70 submersible.

Figure 20:
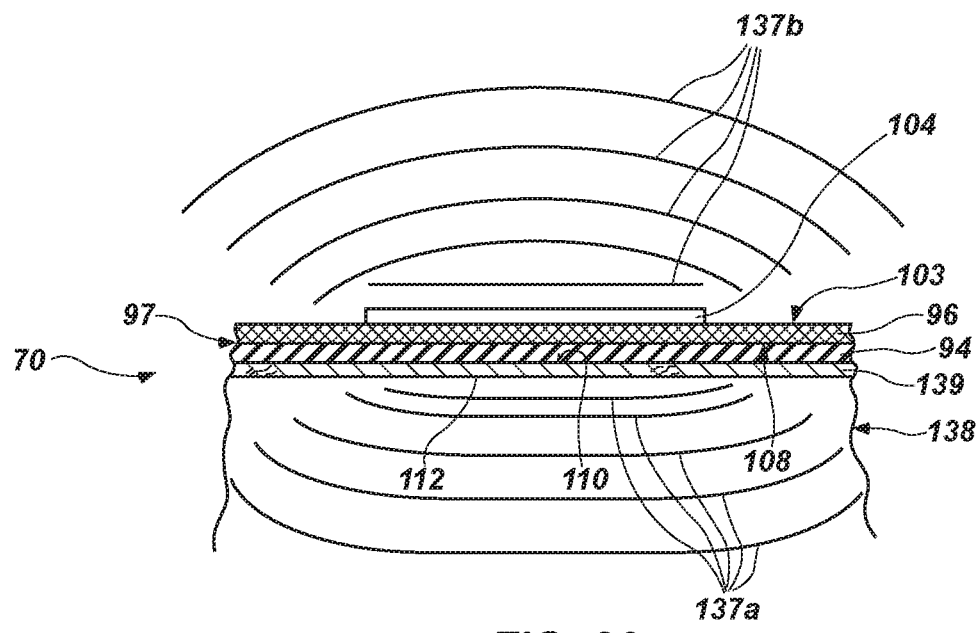
FIG. 20 is a top, plan, schematic view of a piezoelectric transducer of FIG. 14 inducing sound waves to and into a user.
Figure 21:
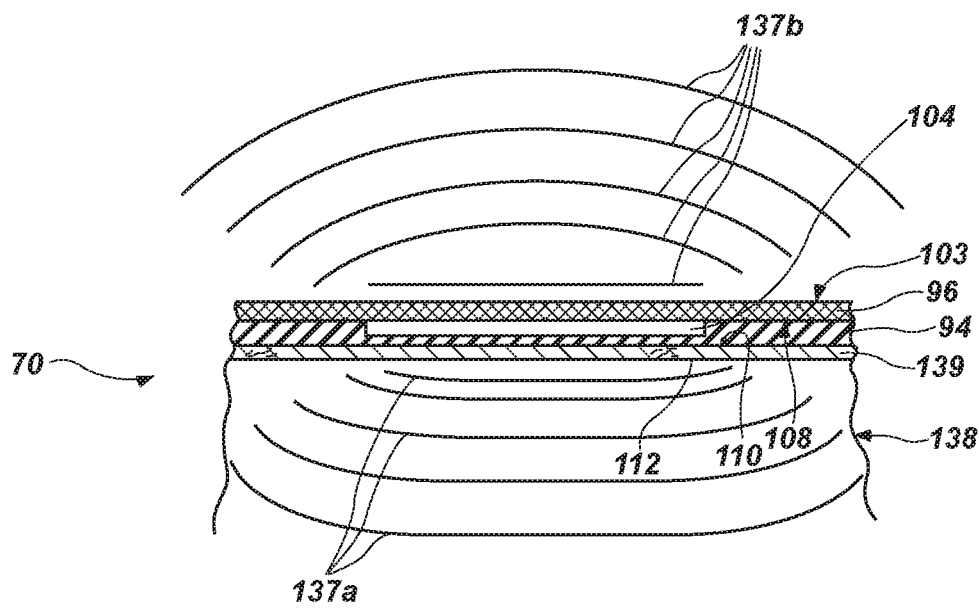
FIG. 21 is a top, plan, schematic view of a piezoelectric transducer of FIG. 15 inducing sound waves to and into a user.

Referring to FIGS. 20 and 21, in the illustrated embodiment, a system 70 and particularly, that portion constituted by the assembly 97 may interact to transmit sonic waves or sound waves into opposite directions. For example, the assembly 97 may include a substrate 96 having piezoelectric transducers 104 or discs 104 secured thereto.

In the embodiment of FIG. 20, the configuration of FIG. 14 is illustrated. Here, the piezoelectric discs 104 or piezoelectric transducers 104 are secured against the face 103 of the substrate 96. Thus, the piezoelectric transducers 104 must propagate the sound waves 137*a* that will eventually be transmitted into the tissues 138 of a user 136. To the extent that the substrate 96 may be a fabric or other porous material, the propagation of the sonic waves 137*a* toward the tissues 138 may be attenuated somewhat by the substrate 96. This is one reason why substrate 96 may beneficially be formed of a silicone, plastic, rubber, or other solid yet compliant material.

Meanwhile, the gel pad 94 is secured at its face 110 to the substrate 96. Thus, the sonic waves 137*a* propagate from the piezoelectric transducer 104 that generates them, through the substrate 96, through the gel layer 94, and into the skin 139 and other tissues 138 of a user 136. Inasmuch as the human body has a high fraction of water in the tissues 138, propagation of the sound waves 137a may be very effective, and has been shown to be effective. Thus, the sonic waves 137a propagated into the tissues 138 from the piezoelectric transducer 104 are actually intercepted and transmitted by and through the skeletal structure of a user 136 as well.

Meanwhile, the audible sound waves 137b are similarly originated by the oscillations of the piezoelectric transducers 104. However, these sound waves 137b are propagated directly into air, or may be propagated directly into air, in order to be heard by the ears or through the ears of a user 136. Thus, in some respects the configuration of FIG. 20 provides a readily audible sound wave 137b in air that is more easily transmitted in air.

Referring to FIG. 21, in certain embodiments, such as those of FIGS. 15 and 16, the piezoelectric transducers 104 may be secured to the face 108 or surface 108 of the substrate 96 rather than the surface 103. This provides improved transmissivity, both by shortened distance and by more intimate contact into the gel pad 94 or gel layer 94, and consequently to the skin 139 and other tissues 138 of a user 136.

However, certain negative consequences may also accrue. For example, the substrate 96, if formed of a polymeric or elastomeric, solid material such as flexible silicone, rubber, or the like, may tend to attenuate the signal of the piezoelectric transducer 104. This may muffle or reduce the intensity of the sound waves 137b propagated through the air and away from the user 136.

One remedy for that attenuation may be to form the substrate 96 of a fabric material, thus providing ready access to air through the face 103 of the substrate 96 as a transmission medium for the sound waves 137b. Meanwhile, with intimate contact and the proximity provided by the transducer 104 embedded right within the gel layer 94, effective transmission of the sonic waves 137a into the tissues 138 of a user 136 would also be optimized.

The piezoelectric elements 104 may be secured to a gel pad 94 in any of multiple ways. In one embodiment, the piezoelectric elements 104 are bonded to a substrate. For example, in one embodiment the piezoelectric elements 104 have electrical leads 106 originating on one face thereof, and the opposite face thereof is bonded to a first side of a substrate 96. On the opposite or second side or face of the substrate 96 is applied a layer 94 of adhesive gel. The adhesive gel 94 may penetrate the substrate, which is typically a porous, non-woven, fabric material.

In other embodiments, the piezoelectric transducers 104 may have their electrode faces bonded to the substrate 96. Then, the adhesive gel 94 may be applied across that same face 108 of the substrate 96, and the exposed, "non-electroded" face of the piezoelectric transducers 104. It has been found that the tactile transmission of the oscillating frequency of the piezoelectric transducers 104 appears to be more effective when the piezoelectric transducers 104 are embedded directly within the gel 94, and the gel 94 is in contact with the tissue 138 (e.g., skin 139) of a user 136. Nevertheless, the adhesion of the adhesive gel 94 is better when more contact area is available. Thus, it has been found most effective to apply the adhesive gel overall contact areas. This would include not only the substrate 96, but also to the faces of the piezoelectric transducers 104.

Figure 22:
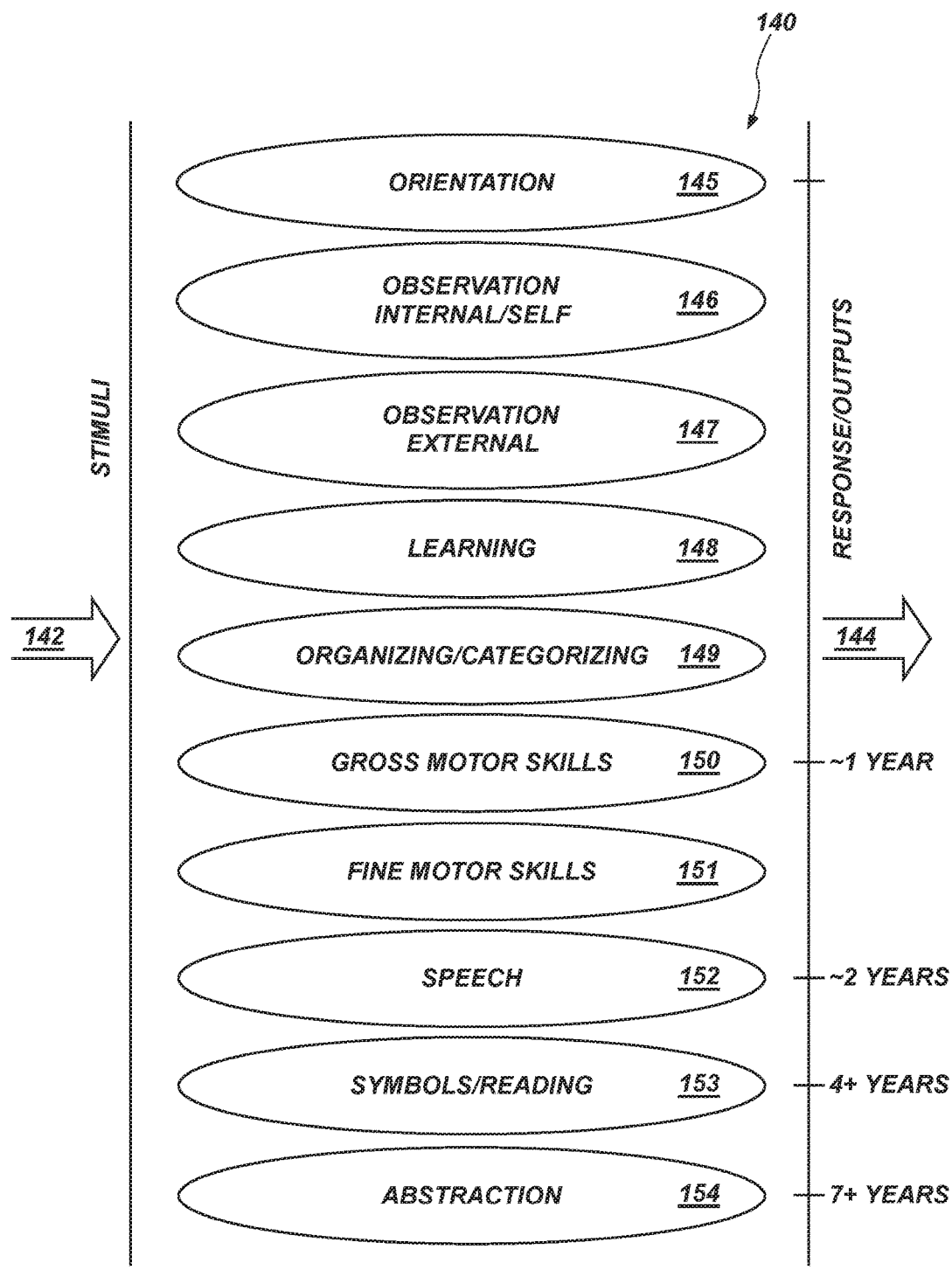
FIG. 22 is a schematic block diagram of a process of learning and responding as a result of stimulus.

Referring to FIG. 22, a chart 140 provides an illustration of a process 140. That is, the chart 140 represents a process 140 of development. Although not entirely rigorously justified, explained, nor described, the process 140 represents certain steps that are observable in the development of a human subject 136. For example, stimuli 142 may arrive through all the senses. Senses include touch, taste, smell, sound, and sight. These are commonly referred to as the five senses.

As a result of stimuli 142 received through any of the senses by motion observed, objects and persons seen, sounds, music, voices, and the like heard, textures touched, objects and foods tasted, various materials and foods smelled, and so forth, an individual subject 136 receives stimuli 142. Likewise, an individual human being will have outputs 144. Outputs 144 may be actions as a result of thinking, may be reactions as a result of stimuli followed by thinking, or may be reactions as a startling.

For example, a common test for newborn infants is the startle response. A loud noise is generated in close proximity to an infant in order to test hearing. The startle response of the infant to the noise assures a medical worker or other person that hearing is well. Similarly, tracking tests are done wherein an object is placed within the field of view of an infant, and the eyes are observed following or tracking the object. This assures that sight, muscular coordination, and the like are normal for the sense of sight.

Similarly, other senses will detect stimuli 142 as a result of tastes, smells, touch sensations, nerve sensations in response to heat, cold, wet, and so forth.

One may think of stimuli 142 as sensations one may observe. Typically, a sentiate or thinking human being as a young child will begin to become oriented or will begin orientation 145 to become oriented. This may be thought of as an event 145, or a process 145. Typically, it has been observed that individuals when they "fall asleep" become disoriented or un-oriented. This implies that the brain relaxes its cognitive control and integration of all the stimuli 142 received through the senses. It allows the mind a certain amount of freedom from bodily stimulations, outside stimulations, and so forth. Thus, a user 136 may relax and sleep.

Dreaming is often a very mixed and confusing assortment of sensations of being in places, moving between home, school, work, a garage, an island, a park, a mountain, and so forth, all within a matter of minutes or moments. Because the mind is disoriented or un-oriented, it is free to process information, largely independent of surrounding realities.

On the other hand, orientation 145 by a human being helps the individual to make observations 146 internal to oneself. For example, perceiving hunger, anxiety, or other sensations internal to oneself may constitute observations 146 by a user 136. Similarly, human beings make observations 147 of external phenomena. For example, the sensation of feeling a breeze blowing, cold, heat, bright lights, dim lights, colors, and the like are external observations 147. An individual who is oriented 145 begins developing correct or true and accurate observations 146 internal to self, as perceptions 146.

Similarly, external observations 147 or external perceptions 147 are also accumulated. From these observations 146, 147 an individual begins learning 148. One may learn 148 facts. One may also begin categorizing and organizing 149 the facts learned 148, thus contributing to additional cognitive learning 148 that involves thinking about and associating facts from the observations 146, 147.

All of these factors contribute to the ongoing development of a sense of self. We have here identified the principle of individuation as that process of becoming aware of self, and distinguishing between self and the external environment. It has been found that certain learning disabilities, regardless of their medical source or organic source, interfere with individuation and thus halt or inhibit observations 146, 147, learning 148, categorizing and organizing 149, or a combination thereof. Thus, an individual for whatever organic reason, regardless of whether temporary or permanent, may fail to become consistently oriented 145.

As infants grow, they typically begin acquiring gross motor skills such as balance and walking at about one year of age. These gross motor skills developments 150 begin immediately at birth. However, they begin to be fully recognizable as controllable by an individual at about the age of one when balance and walking are typically mastered. Later on, fine motor skills development 151 may involve the ability to use the fingers or other digits under more specific control.

Likewise, speech development 152 is sufficiently mature by the age of two years that individuals can typically form words and sentences. Later on, such as from about four to about six years, the development of recognition of symbols 153 and reading 153 as skills are typically observed. Later, as children begin to learn mathematics and arithmetic from about six to about twelve years, abstractions 154 become part of their developed skills. Thus, the development 154 of abstraction and the ability to think abstractly progresses.

It has been observed that if a person does not remain consistently oriented 145, learning 148 of all the skills 149, 150, 151, 152, 153, 154 may be greatly inhibited. Moreover, the ability to precisely perceive or observe 146, 147 may also be inhibited. Thus, individuals who are autistically inclined tend to see their world as containing too much stimulation 142, that appears chaotic, so they are not capable of categorizing and organizing 149.

A system 70 in accordance with the invention does not seek to "cure" autism or learning disabilities. Rather, it seeks to provide another form of stimulation 142 that assists in educating or training or simply empowering a user 136 to be able to perceive 146 internally accurately, and to perceive 147 externally accurately. This is important in order to obtain and maintain an orientation 146 that gives proper perspective on self, external environments, and so forth. Thus, an individual user 136 may learn to provide outputs 144 that are rational, reasonable, and appropriate in response to individual stimuli 142 and accumulated stimuli 142 experienced over time.

Figure 23:
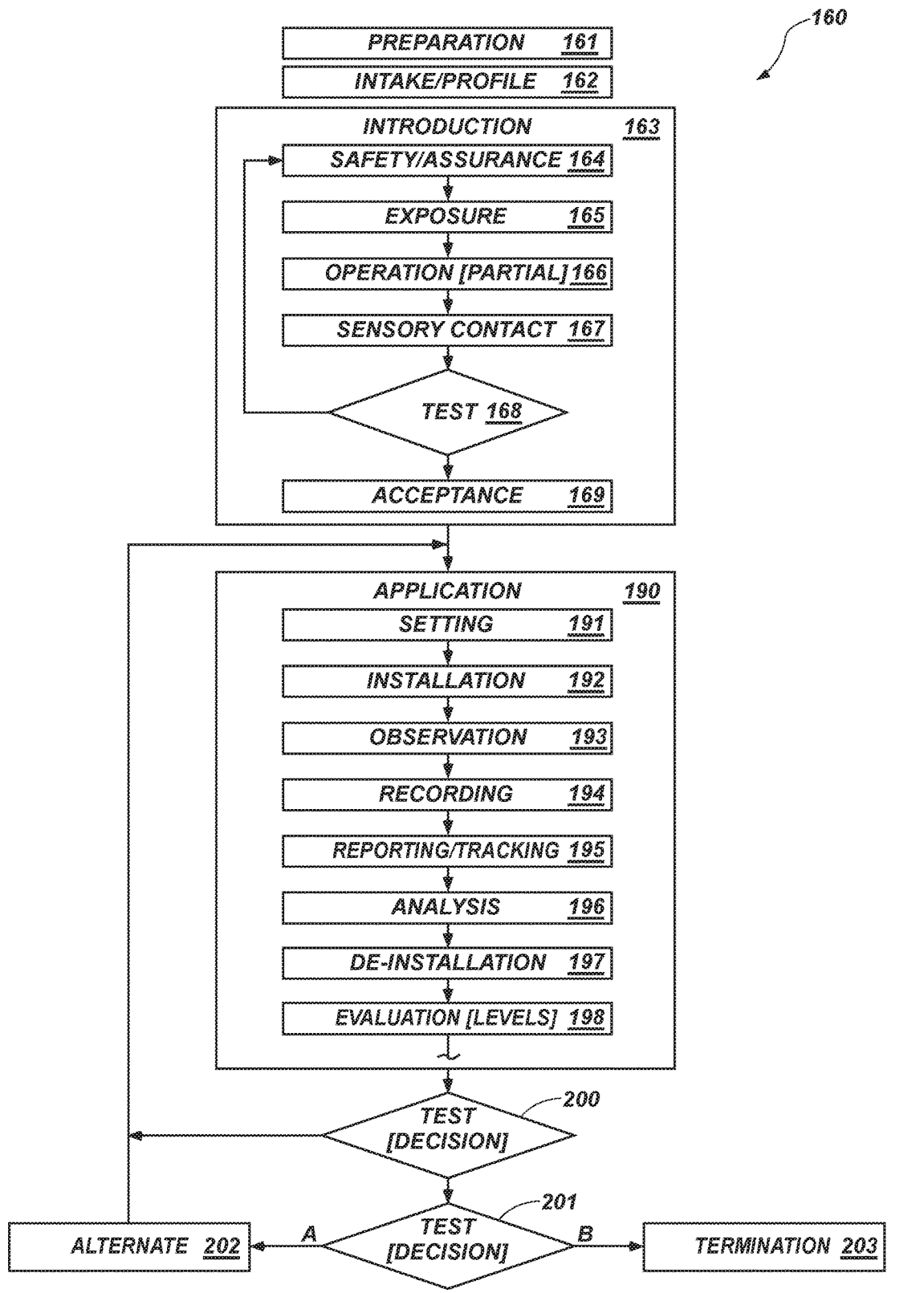
FIG. 23 is a schematic block diagram of a process implemented by an apparatus in accordance with the invention.

Referring to FIG. 23, an individual 136 may undergo a process 160 illustrated. The process 160 at one level may be thought of as including preparation 161. Preparation 161 may involve preparation of information, training facilitators, training a caregiver or principal relation holder with the subject 136, and also communications or preparation of a user 136. After proper preparation, sharing of information, assessments, and so forth, it may be determined that a user 136 is a candidate for application of the NOIT 70.

In the illustrated embodiment, for example, intake 162 or profiling 162 of a user 136 may include tests, observations, assessments, and the like. These may be valuable in order to determine applicability of the system 70 to the user 136, and various mechanisms and expectations for that use.

Later, an introduction 163 of the user 136 to the system 70 may also include several steps. Initially, it has been found effective to provide certain safety 164 or assurance 164. This is typically provided by bringing together a facilitator, the subject 136, and a caregiver already well known to the subject 136. The caregiver is already long relied upon or trusted by the subject 136. Together they introduce 163 the system 70.

Someone who understands the current proclivities of a subject 136 is providing assurance to the user 136. The knowledge of the facilitator provides a degree of safety. Thus, safety 164 and assurance 164 may be provided by the environment, the persons present, and so forth.

Exposure 165 has been found to be very important for some users 136 who are particularly sensitive. Being able to observe, feel, touch, and listen to the system 70 provides an exposure 165 that familiarizes a subject 136 therewith.

Operation 166 may be initiated separate from a user 136. Operation 166 may only be partial. For example, operation 166 may involve holding the system 70 within a field of vision of a user 136, or near an ear in order to allow the subject 136 to hear the tone being propagated by the system 70. Ultimately, listening is only one sensory contact 167. Touching, and feeling the vibration of the piezoelectric sensors 104 may also be conducted without actually applying the system 70 to the body of a user 136.

Ultimately, one may test 168 to determine whether subjectively, objectively, by data, by independent measurement, or by simply manual assessment whether acceptance 169 has been achieved. Once the user 136 has accepted 169 the concept of being in close proximity to the NOIT 70, the NOIT 70 may be applied 190 to a user 136.

The NOIT 70 is secured (applied 190) by removing the film 95 covering the gel layer 94 to expose the adhesive properties thereof to the skin 139 of the user 136. The system 70 may be adhered to the back of a user 136 near the top of the shoulder blades, and centered along the spine just below the collar and between the shoulder blades.

If the test 168 reveals that a user 136 has not yet accepted 169 the system 70, then additional time may be provided for safety and assurance 164, additional exposure 165, sensory contact 167, and so forth. Once acceptance 169 is adequate, then the process of application 190 may occur.

This may begin with setting 191 various parameters and controls for the system 70. Although some settings 191 may be done after installation 192, the setting 191 may be done prior to installation 192. Installation 192 may include applying the actuator 74 or assembly 97 to the back of a user 136 followed by securing the case 80 and its contents to the mount 90 integral to the assembly 97. Thereafter, observation 193 should continue. Meanwhile, observations 193 may be made by individuals, and may also be made by sensors external to the system 70, or internal to the system 70.

Similarly, recording 194 of the observations 193 may involve manual writing, recording on a computer, recording on the memory 16 associated with the processor 14, and the system 70, and so forth. Ultimately, reporting 195 or tracking 195 may involve uploading information recorded 194 from the observations 193. Again, manual intervention may be part of this or all of this. On the other hand, automatic data collection 193, recording 194, and reporting 195 may also be programmed into the systems 10, 70 in order to be uploaded from the system 70 through the port 89, network card 42, or the like.

Analysis 196 may take place within the processor 14 in the system 70, or may occur on some other computer 12 within the system 10. Analysis 196, just as reporting 195 or tracking 195 may occur on a daily basis, weekly basis, instantaneously, or the like. Similarly, depending on the location of the processing for the analysis 196, this may occur within the system 70 or externally based upon periodic interconnection therebetween (between the system 70, and other computers in the system 10).

De-installation 197 is typically required on at least a daily basis. An individual installation 192 may last for minutes, hours, or all day long. However, in order to facilitate sleep, two factors are significant. First, the mechanical configuration of the system 70 would create a hard lump directly under the shoulder area of a user 136. This could be uncomfortable and interfere with sleep. Thus, removing the mechanical system 70 by de-installation 197 is important.

Likewise, and second, the concept of orientation 145 is directed toward consciousness, not sleep. Falling asleep actually involves de-orientating or un-orienting an individual. Literally, falling asleep is an event of dis-orientation or un-orientation. Thus, de-installation 197 is typically done at the end of a day. An installation 192 should be allowed to persist as long as the subject 136 is comfortable with the presence of the device secured to the subject 136.

Ultimately, as an ongoing process, assessments should be made based on the observations 193, analysis 196, based on the reporting 195, and so forth. Thus, various changes may be made.

For example, it has been found that a user 136 who needs application 190 of the system 70 often has heightened sensitivities coincident with the inability to properly manage and respond 144 to the surrounding stimuli 142 of the environment. This has been found to also include the intensity or volume of the signal 137a, 137b produced by the piezoelectric transducers 104. It has been found useful to observe 193 among other parameters, the sensitivity of the user 136 to sound over a period of time of exposure 165 to the system 70.

Often, as orientation 145 proceeds, and becomes more stable, it has been found valuable to assess 198 and modify the settings 191 on the system 70. For example, as hearing becomes less sensitive and less hypersensitive, then the volume or the sound volume may be turned up. the volume may be adjusted up or down as the user deems comfortable. Accordingly, the system 70 in one embodiment has seven levels of sound, each preset in order to be easily accessible.

For example, in one embodiment, the system 70 may have buttons 84, 86, that allow a decrease or increase, respectively by actuating the respective button 84, 86. The system 70 responds by a spoken voice sound, originated by the piezoelectric transducers 104, stating what the level of sound is. Also, the sound level is propagated for a short period of time or for one cycle in order that the facilitator or caregiver can hear, and the subject 136 can hear the level of intensity or volume (amplitude, amplification, etc.) of the tone propagated by the system 70. Thus, the assessment 198 allows changing of various levels of sound volume.

Typically, the button 84 allows sound volume to be dropped by a level. The button 86 provides for the sound to be increased by a level. In one embodiment, the sound levels may be linearly related such that each represents one increment linearly increasing above or decreasing below a sound intensity adjacent thereto. In other embodiments, the sound may be controlled in a binary fashion meaning that each level may double that of a level below, or halve the level of sound of a next higher numbered level.

In other embodiments, the levels may provide a greater range by increasing logarithmically in order to provide a broader range. This may provide more control at one end of the intensity spectrum than the other.

Ultimately, a test 200 may determine whether the system 70 is functioning well, and the subject 136 is needing it less. If the test 200 determines that continued use should occur, then the process 160 may return to the application 190 with the possibility of altering settings or setting 191 a new value of any particular control parameter. Ultimately, a test 201 may be a result of long term stabilization of a user 136.

For example, it has been found in tests that users 136 seem to fall in three major categories. About half the users 136 will eventually stabilize and begin to self wean from the system 70. That is, it is not necessary to wear the system 70 every day or perhaps at all. That is, as the user 136 becomes more oriented 145, he or she wants and needs the system 70 less.

For example, in certain embodiments, the assessment 198 may include evaluating how frequently or how often the propagated sound waves 137 (note that a reference numeral represents an item, and trailing letters represent specific instances thereof) recur. They may have several levels of delay or periods of delay. Typically, the system 70 has been found, as described hereinabove, to operate well at a target cycle time of about eight seconds.

The tone begins and maintains its initial volume intensity for about one half to about one and a half seconds, and typically about one second before it begins decaying. Thereafter, the tone decays for the remainder of the initial seven seconds, followed by about one second of silence. Thereafter, at eight seconds from initiation of the sound waves 137, the system 70 begins again to propagate a new instance of the signal 137.

The delay period has been found to be suitably established in a binary form. Thus, the initial delay of eight seconds at a next, increased, value will be double. The next increase doubles the previous value. And so forth. Thus, it has been found that the buttons 84, 86 can be contrived to operate together to change the time delay.

Actually, time delay may be a changed linear increment, but has been found to be best served with a power series or a binary series where each level represent double the time per full cycle compared to its next lower level. The assessment 198 may result in setting 191 both the time delay and the volume for the signal. If the test 200 has eventually resulted in achieving a suitable level of sound volume and the maximum delay, for some period of time, a test 201 may be conducted to determine whether the user 136 is ready for an alternate system 202 or even termination 203.

The system 10 was developed specifically to address severely affected, learning-disabled subjects 136 who are not capable or who are not willing to use a head set such as headphones or head speakers or a set of earbuds. Once the test 201 has been passed successfully in a mode identified by the branch A, then a user 136 may be transitioned to an alternate therapy 202. The user 136 may rely on something such as headphones or earbuds supported by and connected directly to the head of user 136.

Alternatively, if the user 136 is stabilized, then termination 203 may be appropriate. Even after use of an alternate 202, with continued work on the settings 191 until the assessment 198 shows a suitability for the alternate B, then termination 203 may be appropriate at that time.

As a practical reality, the system 70 is not a medical device. It does not attempt to provide any medical therapy. It is a learning tool 70. As such, it simply provides a stimulus by way of sound waves 137 that allow a user 136 wearing the system 70 to focus on sound and thereby become oriented 145. A user 136 may then advance in the other learning processes or steps identified in the process 140. Individuals have different and unique conditions. These do not lend themselves to a single solution. Thus, for example, the overall calendar time during which continuing application 190 of the system 70 to a user 136 may occur may be mere weeks or may extend for years.

Thus, it has been found that about half the users 136 will self wean and require no, or less frequent, repetition of the tone output by the piezoelectric transducers 104. Likewise, they may transition to an alternate system 202, and may eventually terminate 203 the use of any assistance.

Another group, about a fourth of the subjects 136 using the system 70 will eventually move under the motivation (instigation) of a caregiver to an alternate system 202. Any may return periodically or episodically to using the alternate 202, or even the system 70. At one time, it was believed that one should move away from the system 70, and toward an alternate 202 in all cases. It has subsequently been found that the system 70 in some respects serves very well certain populations 136, and no alternate 202 is necessary. Also, as the cost of manufacturing the system 70 and actuators 74 reduces, the cost of the application 190 over a longer period of time becomes more tractable.

A third group of subjects 136 includes about one quarter of the users 136 of the system 70. This represents about one quarter of that 10 to 15 percent of all learning disabled (e.g., autistic) individuals needing intervention by a NOIT 70. These individuals may never need or be able to be weaned or separated from an ongoing use or application 190 of the system 70. For example, these persons 136 may still require the device for several minutes, or several hours a day. Some may require the use of it all day. Others may simply need an episodic or periodic use of the system 70 or the alternate 202 when backsliding or retrogression is observed.

Figure 24:
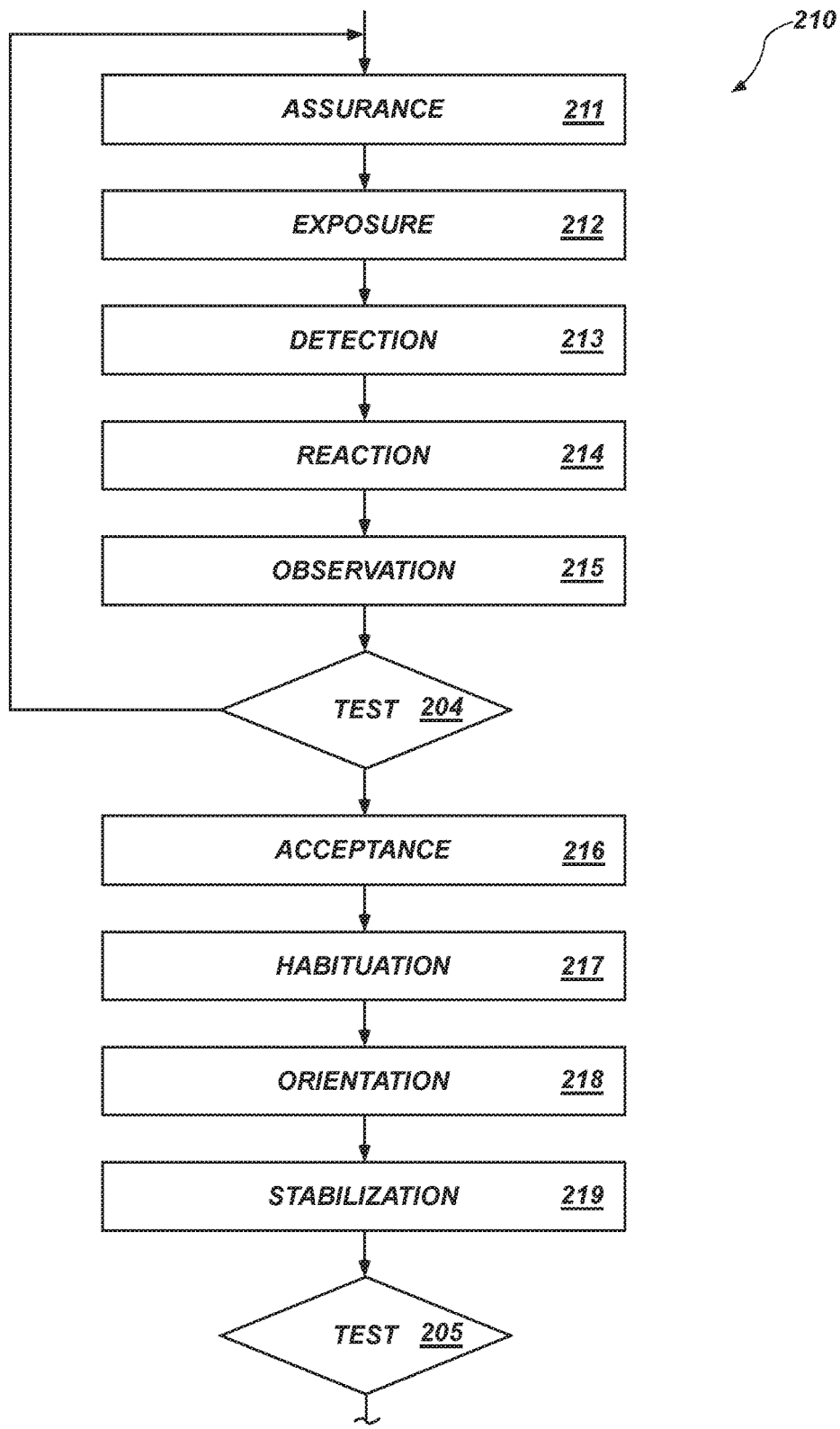
FIG. 24 is a schematic block diagram undergone by a subject during the process of FIG. 23.

Referring to FIG. 24, a process 210 undergone by a subject 136 or user 136 is illustrated. This stands in contrast to the process 160 that is executed either by the system 70, the system 70 in conjunction with other computers 12 in a system 10, or by a facilitator in combination with the system 70 alone or in an overall system 10.

Thus, referring to FIG. 24, a process 210 undergone by a subject 136 involves the process of assurance 211 discussed hereinabove as the safety or assurance 164. Similarly, exposure 212 may correspond to the exposure 165. Thus, the exposure 212 is exposure by the user 136, whereas exposure 165 refers to exposing 165 by the system 70 and the facilitator. Detection 213 by a user 136 corresponds to the sensory contact operation 167.

The reaction 214 then is the response 144 or output 144 of a user 136 to the system 70 as a presence, or connected to a user 136. Thereafter, observation 215 occurs by a user. Eventually, a test 204 represents the process of confirming a coming to acceptance 216. That is, acceptance 216 occurs at some point, based on a user 136 having subconsciously, or completely unconsciously, arrived at the acceptance 216 of the presence and use of the system 70.

Over time then, habituation 217 occurs. In fact, the user 136 may show stress if the system 70 is removed, or if the time delay is extended for too long a time. Eventually, orientation 218 may be deemed to occur. Orientation 218 may actually occur almost immediately, but may not persist. Orientation 218 is a fluid concept that may occur almost immediately after acceptance 216, but may become more permanent or more reliable over time. Ultimately, this results in stabilization 219 of a user. At some point, a test 205 may correspond to one of the tests 200, 201 in which a user 136 has self tested 205, or has come to a state of persistent stabilization 219, the ability to live without constant exposure to the system 70, or with only periodic or episodic exposure. A user 136 persists in self-orienting every day upon waking.

Figure 25:
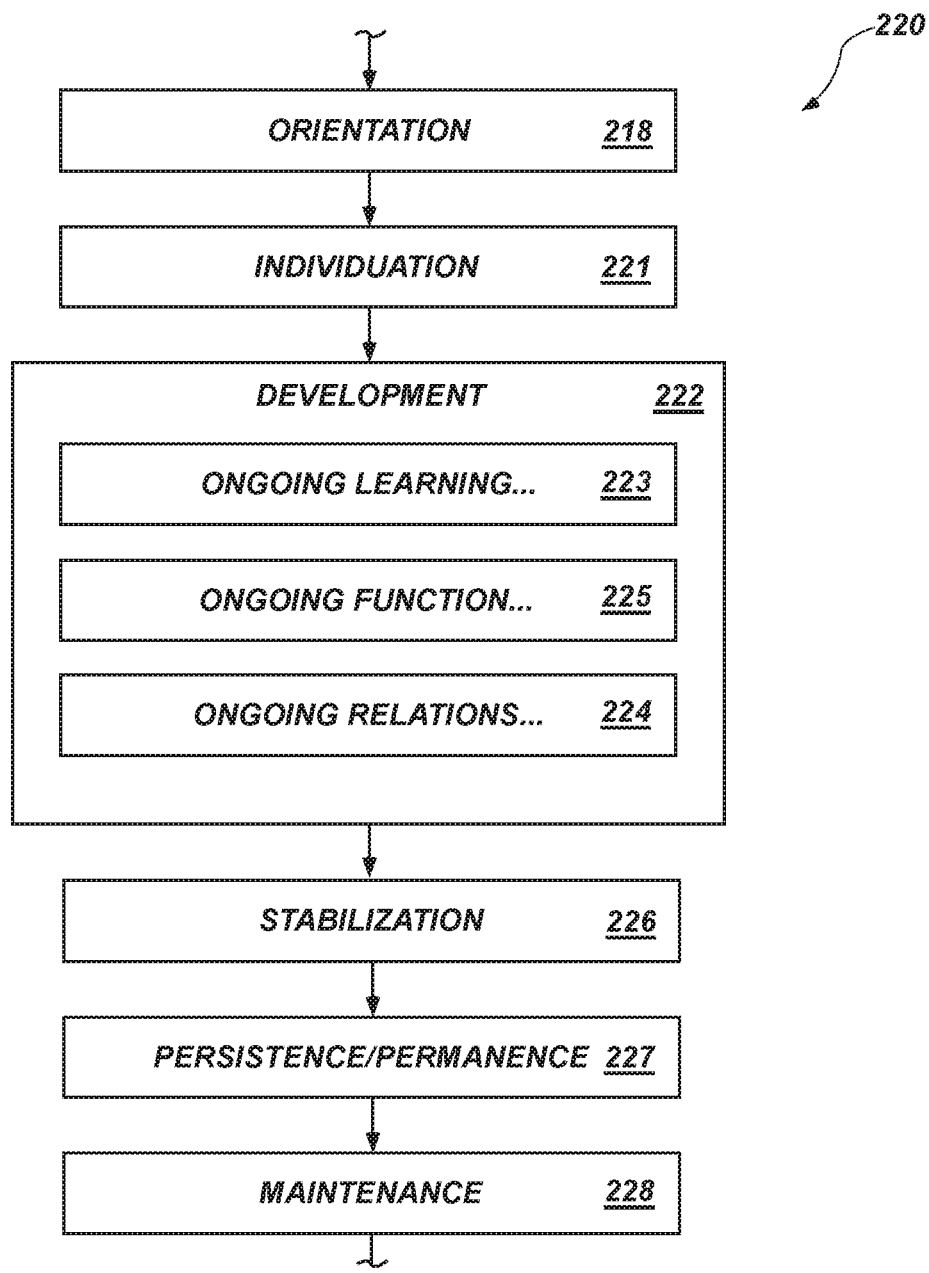
FIG. 25 is a schematic block diagram of additional details of a process partially overlapping and consequent to the process of FIG. 24.

Referring to FIG. 25, in one embodiment, the process 220 reflects the other processes or exposure that a user 136 undergoes after acceptance 216, habituation 217, and resulting orientation 218. Following orientation 218, whether for a short period or long period, individuation 221 begins. In an oriented 145 condition, a user 136 may begin to sense self, speak of self, refer to self, begin to recognize possession of objects owned by the user 136 and acknowledge the differentiation between the individual and other persons nearby. Thereafter, ongoing development 222 may occur. For example, ongoing learning development 223 may involve learning of facts information, and the like useful in daily functioning with objects, alone, or the like. The use of toys, tools, treatment of foods, and so forth may be part of ongoing learning development 223. Likewise, ongoing relational development 224 may occur. This typically involves relationships with other human beings and establishing the individual as distinct from others. It establishes the rights and responsibilities of individuals including oneself in relationship or within the context of all other persons.

Ultimately, ongoing functional development 225 may involve the development of skills rather than simply the perceiving and gathering of accurate information or the relationships 224 developed. Eventually, stabilization 226 may correspond to stabilization 219, or may be thought of as emotional and functional stabilization 226. Ultimately, over time, one objective is permanence 227 if possible. Permanence 227 may involve the permanence of the orientation 218 and the individuation 221, thus requiring either no continued use of either the system 70 or alternate 202, or possibly only episodic or periodic return thereto. At that point, maintenance 228 may involve ongoing use by that fraction of users 136 who do not choose or do not become comfortable completely abandoning use of a system 70 or an alternate 202. Maintenance 228 for some individuals, particularly that third group that never actually weans from the system 70, may involve episodic or periodic use.

Thus, some individuals self wean and become independent from the system 70 and its alternates 202. Others will wean off of those systems 70, 202, but will only do so at the instigation of a caregiver, facilitator, or both. Yet another group may never wean away, but will typically use reduced time or need only a short period of time each day, or a periodic or episodic application of the system 70. Within this last group there may be some who actually permanently need artificial orientation. However, it has not been found necessary so far to continue the use indefinitely on an everyday basis for any subjects 136. Permanent dependence has not resulted.

Figure 26:
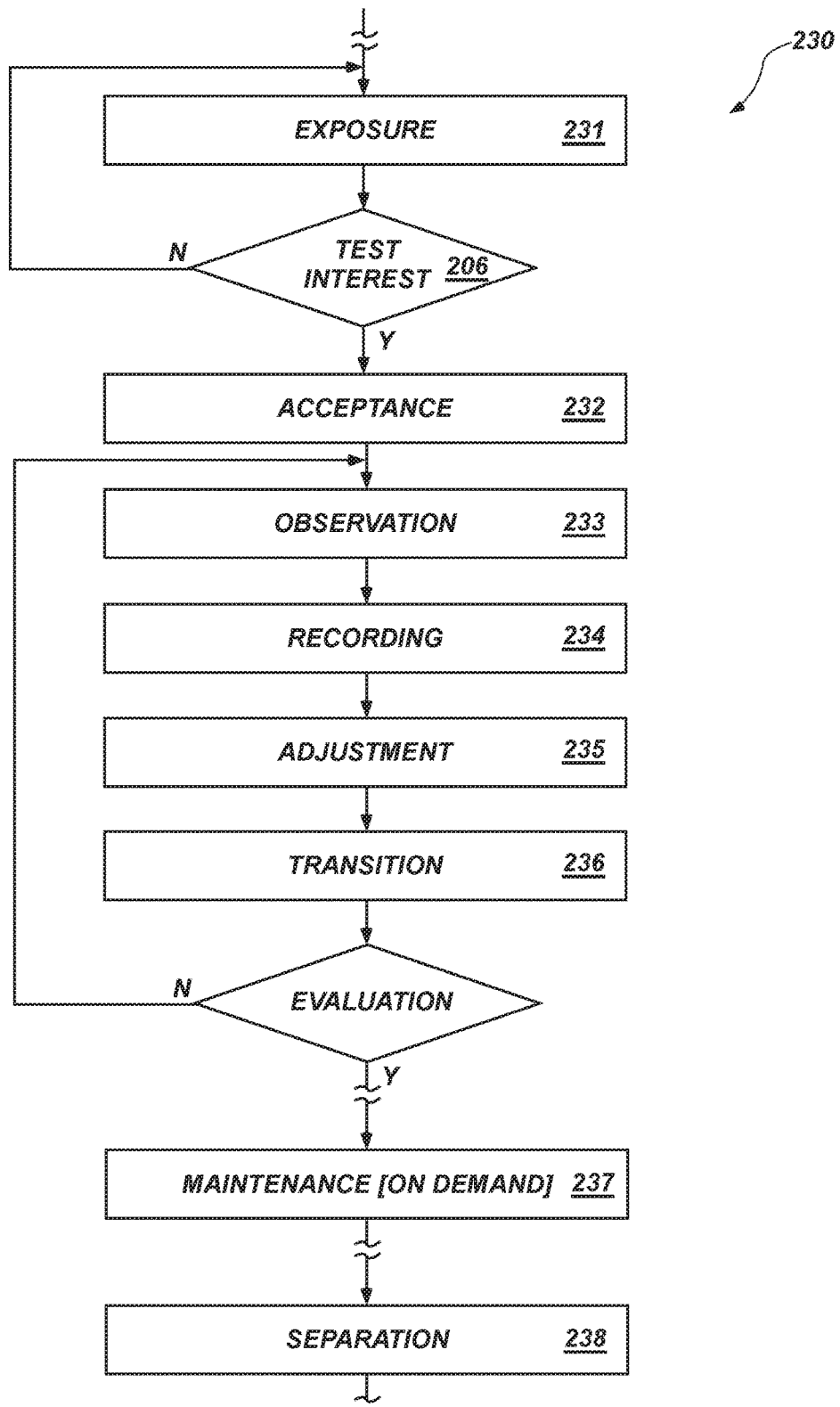
FIG. 26 is a schematic block diagram of a weaning process including multiple, individual outcomes from the processes of FIGS. 23 through 25.

Referring to FIG. 26, in one embodiment, a process of progression away from dependence on the system 70 may involve a procedure 230. For example, a user 136 may be exposed 231 or experience an exposure 231 to an alternative 202 system. Thereafter, a test 206 may determine whether an interest exists. This results in an acceptance 232 of the alternate 202. Thereafter, observation 233 of behavior and recording 234 may be done with the user 136 functioning with the alternate 202. Ultimately, the reduction process 235 may involve using the alternate 202 for less time, with longer delay periods between tones, and so forth. Ultimately, a transition process 236 may lead to evaluations 207.

Evaluating 207 results in ultimately either maintenance on demand 237 or separation 238 from all use of the system 70 and alternates 202. Thus, one may consider the process 230 as a weaning process or a natural process that is arrived at by users 136. Weaning is not always necessary. As discussed hereinabove, three groups, including about half who self-wean away from the system 70 and its alternates 202 is balanced by the other half who are about equally divided between those who are weaned at the instigation of an observer. The observer (caregiver) notices stability and thereby begins to extend the time periods, or transition away from the system 70. This is done by the process 230 of exposing 231 and assessing 206 an interest and thereby progressing through the process 230 of moving to the alternate 202 and then ultimately weaning.

It has been found that the details of the processes of maintenance 237 and separation 238, as well as the transition process vary by individual. Accordingly, notwithstanding various processes have been found effective, no particular one operates for every individual. As a practical matter, human intervention by a person who knows and understands the individual user 136 has been found particularly important. Certain processes may be automated in a computer system 10 of which the system 70 forms a part. However, caregivers typically have spent years knowing every nuance of behavior, expression, and the like of users 136. Accordingly, their assessment would have to be reduced to some artificial intelligence engine in order to replace them. This is not a commercially practicable solution.

Thus, in some embodiments, a weaning process may involve steps such as the following. One may adjust the delay time upward and observe the user 136 for some period of time. If the user 136 is agitated and insecure or retrogresses, then the time period may be moved back. However, as a practical matter, once an individual has stabilized, then it has not been problematic to lengthen the time, and allow the person to restabilize at a extended delay, between cycles of the presentation of the tone.

Initially, it was formulated as a weaning process to adjust the time period up to the next longer delay period and observe any agitation. If agitation or misbehavior and obvious stress occurred then the system 70 was adjusted to put delay time back down to the previous delay time for at least two hours before it was attempted again to extend it.

As a practical matter, the system 70 has operated sufficiently well that an observant caregiver can determine when to try to change the frequency or delay between presentations of the tone. It has been a very gratifying observation of testing of the system 70 to note that about half of the subjects 136 self wean, and do not need the ongoing use of the system 70. Others, wean away under the tutelage of an observant caregiver. Others continue to maintain on demand with periodic or episodic use of the system 70 or an alternate 202.

It has been recommended in testing that if an adjustment to the system 70 produces excessive agitation and misbehavior for more than half an hour that the previous parameters should be set until the individual is stabilized enough to tolerate such a change. Meanwhile, it has been proposed that such a change be made not more than every two hours in testing whether it will be accepted by the user 136.

Similarly, it has been recommended in testing that once a setting has been selected and accepted, selected by the caregiver and accepted by the user 136, that it remain there for at least one full day. Thereafter, other changes may be made in the weaning process.

As a practical matter, some individuals move faster, some much more slowly. Thus, the system 70 has been found to be effective within hours for some subjects 136, and to be unnecessary within a matter of a few weeks. Typically, a process occurs over a period of about four months. However, some individuals 136 require two years with continuing episodic or periodic use. Others within a matter of weeks are permanently separated 238 from dependence on the system 70 or the alternate 202.

The Natural Orientation Induction Tool 70 (NOIT 70) is an electronic instrument useful in educating learning-disabled persons. The Natural Orientation Induction Tool was originated because those learning disabled persons who most need a correct perception and orientation are those who will not tolerate other mechanisms.

For example, typically, persons characterized as autistic may be hyper sensitive to sound, touch, smell, taste, and visual stimuli. Typically, about ten to fifteen percent of autistic subject 136 will not tolerate wearing of a headset. The headset, whether conventional stereo headphones or earbuds, may influence those persons negatively by reason of their contact forces and textures, their visual aspect, as well as their aural effect. They will typically be forcibly removed from the head by a wearer 136 who still desperately needs a natural orientation to be induced by listening to the orienting sound.

Initially, when a NOIT instrument 70 is introduced to a user, the user may react due to hyper sensitivity to various stimuli. The image of the device, its feel, its sound, will typically be perceived. The hyper sensitivity of an autistic individual 136 may exacerbate the perception of annoyance with the NOIT 70. However, over time, as an individual 136 becomes more naturally oriented as a result of the periodic tone and stimulation available from the piezoelectric elements 104 thereof, sensitivities become more normal, and volume of sound 137, for example may need to be increased. That is, with the presence of a NOIT 70, with its persistent, periodic, audible 137*b* and tactile 137*a* stimuli, the hyper sensitivities normalize or go away, as sensitivities of a user 136 are oriented and become consistent with "normal" persons.

One may think of a NOIT 70 in certain embodiments as a mobile stereo listening system 70. The Sony Walkman® was a sound system that predated modern MP3 players, the Apple iPod,® and other portable audio devices. However, those devices included speakers worn on the head, and a playback device typically held in a pocket or case. One may think of the NOIT 70 as a portable source of both aural 137*b* and tactile 137*a*, sonic stimulus.

Two important features of the NOIT 70 are first that the sound is comparatively clean. It does not include other random noise. Nor is it permitted to have the variety that music has. It has been found that learning disabled individuals, such as those subject to Autism, Angleman's Syndrome, and Dyslexia, typically enjoy listening to music. The music listened to by individuals varies across a multitude of genres. Notwithstanding individuals enjoy the music, it often does not provide orientation. However, it is often calming. Perhaps it is the rhythmic repeatable quality thereof that assists. However, it has not been found effective to sufficiently orient the individual in order to improve learning.

Here, having a clean sound, a bell tone that decays over time, propagated and sufficiently close to the ears, provides a sonic signal 137 that an individual can effectively "forget." That is, it very quickly fades into or becomes integrated with the background environment. Therefore it becomes non-disruptive. However, its persistence, clarity, proximity, and so forth allow it to become a focus attention, of the "mind's eye," regardless of whether considered conscious or subconscious, such that an individual wearer 136 eventually becomes naturally oriented to accurately perceive one's self and received sensory stimuli.

Weaning from the NOIT 70 varies with various subjects. For example, with some subjects, weaning is almost instant. Orientation occurs comparatively quickly, even within the first hours or days. Thus they may maintain natural orientation after wearing the NOIT for a short period of time. Other users 136 have worn the NOIT 70 for some portion of a day over extended periods of time, even months and years, and still feel most comfortable continuing to wear the NOIT 70 in order to obtain or maintain a natural orientation.

Kinesthetics may be thought of as the body's ability, and thus the mind's ability, to monitor where the body parts are. With eyes open or closed, with the ability to hear or not, an individual may move. However, all the bodily senses go into detecting the bodily members. Thus, the body, and therefore the mind, will be aware of where each bodily member is.

For example, if an individual is dizzy, they typically have lost the balance and the orientation that the inner ear provides. Spun around and then released to walk, a dizzy individual will typically tip over. Perception affects balance.

Likewise, learning disabled people, often have difficulty with balance, due to a lack of orientation. It has been demonstrated that within a very short period of time, on the order of days to less than two weeks a dyslexic user 136 can improve reading levels that have previously been distorted by distorted perceptions.

Study shows that an explanation can be made. A lack of orientation inhibits the ability to perceive, read, and understand. Individuals afflicted with dyslexia, the dyslexia is not "cured" by creating an improved orientation. Rather, by the teaching of an orientation or imposing an orientation, perceptions are improved. Once perceptions are improved, much of the confusion in perception and therefore learning may be corrected. In other words, improved perceptions clarify confusion, so that learning disabled persons will learn better and faster.

Persons who are learning disabled, specifically with dyslexia, may actually have substantial perceptual flexibility. This perceptual flexibility is both an asset and a problem. Typically, these persons can reshuffle confusing things in order to determine meaning. Speed reading and other teaching techniques rely on the brain's phenomenal capacity to absorb individual facts, and automatically (non-consciously) order them.

Thus, a person with dyslexia actually appears to process much faster than others the changes caused by moving around the order of stimuli, images, sounds, or the like. Thus, such persons can intuit complex changes. However, this kind of information is both actual and typical in the natural world of real objects and persons perceived by an individual.

On the other hand, symbols, such as letters, do not have an inherent meaning. Symbols are abstractions that have meanings assigned to them, which meanings must be learned. Thus, to the learning disabled, reshuffling symbols has no context in experience or reality.

For example, a dyslexic person sees a symbol as confusing. The mind tries to scramble and rearrange the symbols. However, the symbols have no inherent meaning. Therefore, the mind fails to interpret the symbols. This may cause stress. The stress reinforces the perception of confusion. Thus the mind refuses to continue. This cycle may be broken by improving perception. Dyslexia causes perceptual confusion episodically. Autism has chronic perceptual confusion. With respect to the instant invention, the medical cause of autism remains irrelevant and uncured.

EXAMPLES

It has been found that orientation of an individual is a major consequence of an autism dysfunction or an autistic condition. Individuals are disoriented or un-oriented. When conventional methods are inadequate or impossible, a self-adhering auditory and physical sensory stimulating system 70 may be affixed to the skin 139. It is positioned below the collar on the spine between the tops of the shoulder blades. This has the effect in field trials of reducing or eliminating perceptual distortions and disorientation of the wearer 136 (subject 136).

The system 70 has the effect of creating in the "mind's eye" an "orientation point" that is located approximately six inches behind and about six inches above the head of a user. This position may be changed, but has been found to be most effective at about this range. It may still be effective at from about two to about twelve inches away from the user. However, the six inch measurement (back and up) from the head of a user has been found suitable. Also, elevation may be just above eye level.

Also, a counseling procedure has been provided for providing a kinesthetic sense to establish an oriented state. A counseling procedure uses the auditory senses, as well as the sense of balance or motion to bring about an oriented state in a user. The inventor has developed such process.

The procedure with a headset or ear buds has been replaced in a method and apparatus in accordance with the instant invention in order to service the needs of autistic individuals who lack the ability or inclination to use conventional hearing systems such as earbuds, stereophonic headphones, or the like.

Example 1

A NOIT 70 was installed on a child subject to Angelman's Syndrome. The child was incapable of walking, or speaking. Over a comparatively short period of time (e.g., weeks) the child began walking and speaking. Thus, by merely acquiring a natural orientation provided by the NOIT 70, the child's perceptions were changed, and the child could begin processing information accurately and without the previous confusion.

Example 2

A NOIT 70 was applied to an Alzheimer's subject 136. Over time, the individual showed decreased confusion, the disorientation normally associated with the condition.

Example 3

In another case study, a child of the age of about six and a half years had been non-verbal and used a system 70 in accordance with the invention for a period of six months for up to about ten hours per day. This child was consequently able to use a headset, which had not been possible earlier due to the child's behavior. This child completed work on concepts of self, change, and consequence, information important to understand in order to move past the conditions of autism.

The child who spent a majority of time prior to the use of the system 70 in a condition that appeared disoriented, filled with self stimulation with horses and helicopters was oriented to the environment afterward, and behaved much more appropriately. Social interaction could be considered normal and typical of a child of eight years upon completion of use of the system 70 in this trial.

At the onset of the trial the child could use five words that could be understood. Within weeks, the child was able to speak more clearly, used new single words, used names appropriately, and within four months had recognized the concept of self by using words such as me and mine. Moreover, abstract phrases that included pronouns like "it,"

and articles like "the" which are abstractions in language, were also included in the speech of this subject. As a result, family of the subject moved exclusively to therapy with the system 70 and moved on to doubling speech therapy as it was now much more productive.

Example 4

An example of a man of the age of 44 who lived in an assisted living situation and was required to take several medications, included about two and a half hours per day for about four months of exposure to the system 70. Qualitative data from the logs showed improved use of eye contact, use of pronouns, and a calm, happy disposition, all indicative of improvement over the initial autistic condition. Moreover, work sessions devoted to self, change, and consequence were successfully completed.

Example 5

In another example, a child of the age of 17 was verbal until the age of 4, but had subsequently moved into autistic behaviors. The system 70 after use for a single week had oriented the subject sufficiently that both a headset and the system 70 could be used over a period of five weeks. Eventually, the subject was able to transition to a headset exclusively for the remaining nine weeks of the test.

Data was collected for periods of from about eight to about twelve hours per day over a period of fifteen weeks. It was discovered that the headset was positioned wrong, resulting in a period of regression, which was recovered. Thus, the system 70 enabled the subject to improve use and wear the headset for two hours per day with no regression observed.

The largest change observed was less inappropriate social behavior, and less of the ritualistic, self stimulating behaviors and self injury that are often associated with autism. The subject no longer snatched food from others, and had reduced the behavior of putting inappropriate objects in the garbage, or rummaging in the garbage. Likewise, decreased pica activity, flicking of fingers, rinsing fingers, and throwing inappropriate objects out of the window were all observed.

Moreover, the subject was beginning to recognize himself as an individual, a key factor in autism behaviors, by using full sentences that included himself and the objects of his desire such as, "I want you to", etc. Likewise, "I want to listen to a tape" and "I want a cookie" as well as "I want you to read a book" and the use of the "I" pronoun and verbs all occurred around the thirteenth week of the trial.

Example 6

In another example, a child of the age of 17 used the system 70 for a period of nineteen weeks and abruptly stopped for a holiday. Certain regression was evident upon returning to the program. Qualitative gains were observed in self advocacy, reduced need for autistic rituals, improvements in creating relationships, less expressions of rage, and so forth.

Example 7

In yet another example, a child subject 136 was not willing to allow the system 70 to be used. Eventually, after short periods of use, by permission from the child, the child became more familiar with the system 70, and began spending more time. Eventually, the child could wear the system 70 and reported that she felt "awesome" when wearing the system 70. This child was often able to wear the system 70 for periods of about an hour and a half.

Qualitatively the child seemed to be much different, less bothered by chaos of a friend who was similarly situated, but not being treated by the system 70. The child was able to separate herself from the chaos caused by the other child, establish order, and even had behavior sufficiently normal to be taken to a local restaurant for a meal, with behavior described by the caregiver as "beautiful."

The child 136 continued to wear the system 70 for about one and a half hours per day during her waking time and also for shorter periods of from about three to about five minutes several times during the day. The child was observed to have increased her awareness of herself, a key characteristic needed by autistic children, and became more aware of and possessive of her "stuff," such as books, games, computers, and the like. She became more aware of items such as clothing of hers, and became more independent in being able to dress herself and to dress herself with clothes in proper orientation.

Why is it useful to have the sound originate from behind the head and above the line of sight, even above the head? For example, in some embodiments, the sound appears or is perceived by a user to originate from about six inches behind and about six inches above the head. It has been determined that if a person can begin to have more of a "birds eye view" of the world, including oneself, it is possible to cause other perceptions by the user to be more accurate.

One difficulty in the education or training of learning disabled persons, such as those with autistic tendencies, is a lack of accurate perceptions. Another difficulty has been the inability to accurately perceive oneself, or actually sense one's individuality. Concepts of self, individuality, ownership are typically absent in autistic individuals. It appears that many autistic individuals are not perceiving themselves as individual entities, and therefore do not have an orientation or context from which to observe stimuli, aural, visual, and so forth, that keep bombarding them. Thus, it has been found that orienting "the mind's eye" to see or perceive not only the stimuli being received by the user, but also perceiving the "self" also of the user allows the user to begin to see their own individual self in the context of surrounding stimuli, such as sound, sight, touch, other senses, and so forth. In reality, one may also think of this as the user or wearer perceiving stimuli in the context of one's self.

One exercise for teaching persons diagnosed with dyslexia is to have them perceive themselves standing behind and above themselves. This may be done as a visualization exercise within their own mind. Non-verbal autistic individuals often lack the ability to understand or comply with such directions. Thus, the NOIT 70 provides this point of view involuntarily by drawing attention to such a point of reference in the space near a user 136.

It has been found to be more effective to originate perceptions near and about a location than right at the exact location. Thus, in one embodiment, a specific orienting sound 137, such as the decaying bell chime is moved about a location behind the head and above the line of sight. Thus, the sound during recording may be moved above and below a target location, and from right to left about the target location. Meanwhile, microphones embedded at the location of eardrums in a model head provide the detection at the desired spots in order to replicate the artifacts of sound as perceived by a real person hearing the real and original sound, originating about the real position behind and above the hearer. The bell or chime was produced, or the tone thereof was produced, about the proper location, crossing back and forth through that location and later replicated by the NOIT 70. The recorded sound ranges from about 20 kilohertz to about 40 kilohertz.

In one embodiment of an apparatus and method in accordance with the invention, resetting values of parameters in the NOIT 70 may be led, followed, or both by generation of a vocal word. For example, upon adjusting sound, a voice may be heard from the piezoelectric transducers operating as speakers to say level one, or level two, or the like. Then a tone may play. Subsequently, the voice may repeat. In other embodiments, the voice may simply be generated either before or after a tone is played. Thus, an operator may touch a control button to change delay time or volume, for example, and a voice may announce, confirm, or the like the particular setting or level. Steps and processes described herein may be executed by modules 131, stored in memory 16 and executing on a processor 14 of a computer 12 in a system 10. Step labels describe such modules and such steps or processes.

In one presently contemplated embodiment, half of each word is actually propagated by each of the piezoelectric transducers 104. Inasmuch as the piezoelectric transducers 104 operate in pairs, to provide a stereophonic and multi-media effect, it is important to be assured that no electrical failure has occurred. Thus, one test mode built into the NOIT 70 is to have each piezoelectric transducer 104 responsible to provide half of each word. For example, if the NOIT provides the expression "level two" each word or half of each word may be generated by only one of the piezoelectric transducers 104. Thus, if one transducer 104 has failed, or its electrical connection has failed in any way, then only half of each message of each word is heard. One may remove and replace the pad with its associated transducers. If the NOIT itself has failed, new transducers will result in the same failure to deliver the complete words.

The present invention may be embodied in other specific forms without departing from its fundamental functions or essential characteristics. The described embodiments are to be considered in all respects only as illustrative, and not restrictive. All changes which come within the meaning and range of equivalency of the illustrative embodiments are to be embraced within their scope.

What is claimed and desired to be secured by United States Letters Patent is:

1. An apparatus focusing attention of a student, as a user, by inducing sound waves into the body of the user simultaneously through air to the ears thereof and through a tissue remote from the ears, the apparatus comprising:
    a driver comprising a controller operably connected to control an actuator;
    the actuator comprising at least two transducers, the actuator sized and shaped to position in direct contact with skin of a subject, remote from the ears, and to oscillate in a range of frequencies audible to a human;
    the actuator, wherein the at least two transducers are positioned apart a distance selected to produce sound waves simultaneously into the body through the skin and to the ears through air, stereophonically balanced to be perceived to originate away from the actuator;
    the driver, wherein the controller is programmed to oscillate the at least two transducers simultaneously and repeatedly at a periodicity selected to focus attention of the subject continuously a distance away from the subject.

2. The apparatus of claim 1, wherein:
    the at least two transducers are positioned symmetrically and remotely with respect to the head of a user;
    the sound waves are characterized by a frequency defining a tone occurring at a periodicity defining a repetition rate; and
    the positioning of the at least two transducers, the frequency, and the periodicity are selected to be effective to cause perceptions of the subject to be interpreted accurately.

3. The apparatus of claim 2, wherein the range is selected to be from about 3000 Hertz to about 6000 Hertz.

4. The apparatus of claim 3, wherein the range is selected to be from about 4.2 KiloHertz to about 4.5 KiloHertz.

5. The apparatus of claim 2, wherein:
    the positioning is selected to originate the sound waves in a manner to be perceived by the subject to originate at a single perceived location remote from the at least two transducers and spaced away from the head of a user a distance above and behind the head.

6. The apparatus of claim 5, wherein:
    the controller is programmed to control the at least two transducers to initiate a first tone at a first time, to extend over a duration constituting a first period of time; and
    the controller is programmed to control the volume of the tone during the first period of time at a level of energy corresponding to a sound volume audible through ambient air to the subject; and
    perceived location and sound volume are selected to be effective to "orient" the subject, where orienting is to focus the attention of the subject for a time effective to cause the subject to begin perceiving accurately sensations detected by at least one of the five senses of the subject.

7. The apparatus of claim 6, wherein:
    the controller and the at least two transducers are operably connected to initiate a second tone at a second time for a second period of time, with a delay therebetween adjustable in response to maintenance by the subject of the orientation.

8. The apparatus of claim 7, wherein the first and second tones have the same frequency and a volume that decays therebetween.

9. The apparatus of claim 7, wherein the controller is programmed to:
    control an elapsed time of the delay; and
    repeat in the second tone a characteristic of the first tone, comprising at least one of a duration, volume, decay, and frequency.

10. The apparatus of claim 9 wherein:
    the controller is programmed to produce the first tone and second tone through the at least two transducers, substantially identical in frequency and volume; and
    the actuator is connected to the skin absent appreciable air throughout a continuous path therebetween.

11. A system comprising:
    a controller,
    an actuator operably connected to the controller;
    the actuator, comprising piezoelectric transducers sized and positioned to produce sound waves;
    the actuator, sized and shaped to secure to, and transmit a first portion of the sound waves through, skin of a subject;
    the actuator, sized and shaped to transmit a second portion of the sound waves through air to ears of a subject; and the controller, programmed to control the piezoelectric transducers to produce the sound waves having physical characteristics and locations of origin selected to cause the subject to perceive the second portion of the sound waves as originating from a single remote location spaced away from the subject.

12. The system of claim 11, wherein the remote location is above and behind the head of the subject.

13. The system of claim 11, wherein the remote location is above and behind the actuator when secured to the subject.

14. The system of claim 11, further comprising a securement mechanism acoustically coupling the actuator to the skin of the subject.

15. The system of claim 14, wherein the securement mechanism comprises a gel selected to adhere to the subject, providing a substantially contiguous and continuous path for the sound waves into the subject.

16. The system of claim 11, further comprising:
a housing selectively securable to and removable from the actuator;
a circuit board operably connectable to the actuator and controller; and
buttons in the housing operably connected to receive inputs from an operator effective to alter operation of the controller.

17. The system of claim 11 wherein at least one of the duration, volume, decay, and frequency of the sound waves is selected to be effective to cause the user to accurately perceive sensations received from at least one of the five senses thereof, by focusing the attention of the subject persistently on the remote location.

18. A method of training a subject having a learning disability, the method comprising:
providing an actuator comprising at least two piezoelectric transducers sized and positioned to produce sound waves, transmitting the soundwaves simultaneously into the body of a subject by mechanical contact and acoustically through air to ears of the subject, simultaneously;
securing the actuator to skin of a subject;
controlling the piezoelectric transducers to produce the sound waves having physical characteristics and originating from locations selected to be perceived by the subject as originating at a single remote location spaced away from the actuator; and
generating the sound waves effective to focus consistently the attention of the subject on the single remote location.

19. The method of claim 18, wherein:
the learning disability of the subject comprises mental perceptions not accurately reflecting actual perceptions detected by at least one of the five senses of the subject;
the sound waves are selected to be repeating at a constant value of periodicity; and
the remote location is at least one of above and behind the head of the subject.

20. The method of claim 18, further comprising, securing the actuator on the body of the subject in a location inaccessible by the user and fixed with respect to the user.

* * * * *